United States Patent
Hasegawa

(10) Patent No.: US 11,954,552 B2
(45) Date of Patent: Apr. 9, 2024

(54) RFID TAG SUBSTRATE, RFID TAG, AND RFID SYSTEM

(71) Applicant: KYOCERA Corporation, Kyoto (JP)

(72) Inventor: Takeshi Hasegawa, Kyoto (JP)

(73) Assignee: KYOCERA CORPORATION, Kyoto (JP)

( * ) Notice: Subject to any disclaimer, the term of this patent is extended or adjusted under 35 U.S.C. 154(b) by 42 days.

(21) Appl. No.: 17/771,041

(22) PCT Filed: Oct. 21, 2020

(86) PCT No.: PCT/JP2020/039583
§ 371 (c)(1),
(2) Date: Apr. 22, 2022

(87) PCT Pub. No.: WO2021/085269
PCT Pub. Date: May 6, 2021

(65) Prior Publication Data
US 2022/0398389 A1    Dec. 15, 2022

(30) Foreign Application Priority Data
Oct. 28, 2019   (JP) .................................. 2019-195328

(51) Int. Cl.
*G06K 7/10*        (2006.01)
*G06K 19/07*       (2006.01)
(Continued)

(52) U.S. Cl.
CPC ..... *G06K 7/10316* (2013.01); *G06K 19/0723* (2013.01); *H01Q 7/00* (2013.01);
(Continued)

(58) Field of Classification Search
CPC .......... G06K 7/10316; G06K 19/0723; G06K 19/07784; H01Q 7/00; H04B 5/0081; H05K 2201/10098
(Continued)

(56) References Cited

U.S. PATENT DOCUMENTS 9,607,258 B2 * 3/2017 Murayama ............... H01Q 7/00
2012/0326931 A1   12/2012 Murayama et al.

FOREIGN PATENT DOCUMENTS

JP    2000-261230 A    9/2000
JP    2006-042097 A    2/2006
(Continued)

*Primary Examiner* — Toan C Ly
(74) *Attorney, Agent, or Firm* — Volpe Koenig

(57) ABSTRACT

An RFID tag substrate includes an insulating substrate that has a mounting region in which a semiconductor device is disposed, the mounting region being included in a first surface of the insulating substrate, and a coil that is positioned at an outer edge portion of the insulating substrate. The coil includes a plurality of first coil conductors and a plurality of second coil conductors that are wound such that the first coil conductors and the second coil conductors each have the same number of turns and such that a direction in which the first coil conductors are wound and a direction in which the second coil conductors are wound are opposite to each other. The first coil conductors and the second coil conductors are alternately arranged in a thickness direction of the insulating substrate and connected in series to one another.

18 Claims, 17 Drawing Sheets

(51) Int. Cl.
  *H01Q 7/00* (2006.01)
  *H04B 5/00* (2006.01)
  *H05K 1/02* (2006.01)
  *H05K 1/16* (2006.01)
(52) U.S. Cl.
  CPC ........... *H05K 1/0243* (2013.01); *H05K 1/165* (2013.01); *H05K 2201/10098* (2013.01)
(58) Field of Classification Search
  USPC ....................................................... 235/451
  See application file for complete search history.

(56) References Cited

FOREIGN PATENT DOCUMENTS

| | | |
|---|---|---|
| JP | 2007-102348 A | 4/2007 |
| JP | 2007-200009 A | 8/2007 |
| JP | 2019-024186 A | 2/2019 |
| WO | 2011/108340 A | 9/2011 |
| WO | 2014/088028 A1 | 6/2014 |

\* cited by examiner

RFID TAG SUBSTRATE, RFID TAG, AND RFID SYSTEM

TECHNICAL FIELD

The present disclosure relates to an RFID tag substrate, an RFID tag, and an RFID system.

BACKGROUND

In recent years, non-contact information communication means using a radio frequency identification (RFID) system have been widely used as IC cards for electronic money and stock control tags. An example of an RFID system is an electromagnetic induction system that uses a frequency in the HF band, and an example of such an RFID tag that uses the HF band is an RFID tag in which a semiconductor device is mounted on a substrate provided with a coil conductor. Transmission and reception of information between the semiconductor device and an external device is performed by radio frequency (RF) communication. An induced current is generated in the coil conductor by a magnetic flux generated along with radio waves that are transmitted by the external device, and electrical power that is necessary for operations of the semiconductor device including writing and retrieving of information is supplied.

International Publication No. 2014/088028 discloses an RFID tag in which the resistance of a coil conductor is reduced by increasing the line width of a portion of the coil conductor so that the Q value is improved. In addition, Japanese Unexamined Patent Application Publication No. 2019-24186 discloses an RFID tag in which the inner diameters of a plurality of coil conductors that are arranged in an insulating substrate in a thickness direction are set to be different from each other in the thickness direction of the insulating substrate in order to stabilize a communication state.

SUMMARY

An RFID tag substrate of the present disclosure includes an insulating substrate that has a mounting region in which a semiconductor device is disposed, the mounting region being included in a first surface of the insulating substrate, and a coil that is positioned at an outer edge portion of the insulating substrate. The coil includes a plurality of first coil conductors and a plurality of second coil conductors that are wound such that the first coil conductors and the second coil conductors each have the same number of turns and such that a direction in which the first coil conductors are wound and a direction in which the second coil conductors are wound are opposite to each other. The first coil conductors and the second coil conductors are alternately arranged in a thickness direction of the insulating substrate and connected in series to one another.

An RFID tag of the present disclosure includes the RFID tag substrate having the above-described configuration and a semiconductor device mounted on the RFID tag substrate.

An RFID system of the present disclosure includes the RFID tag having the above-described configuration and a reader-writer including an antenna that transmits and receives a radio wave to and from the RFID tag.

DETAILED DESCRIPTION

Figure 1:
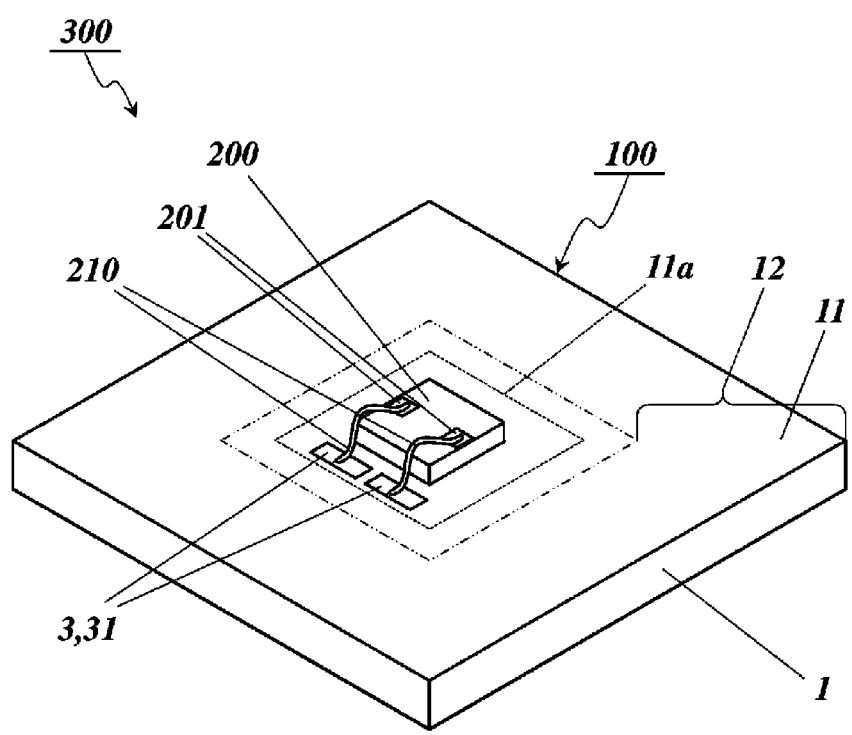
FIG. 1 is a perspective view illustrating an example of an RFID tag substrate and an example of an RFID tag.
Figure 2A:
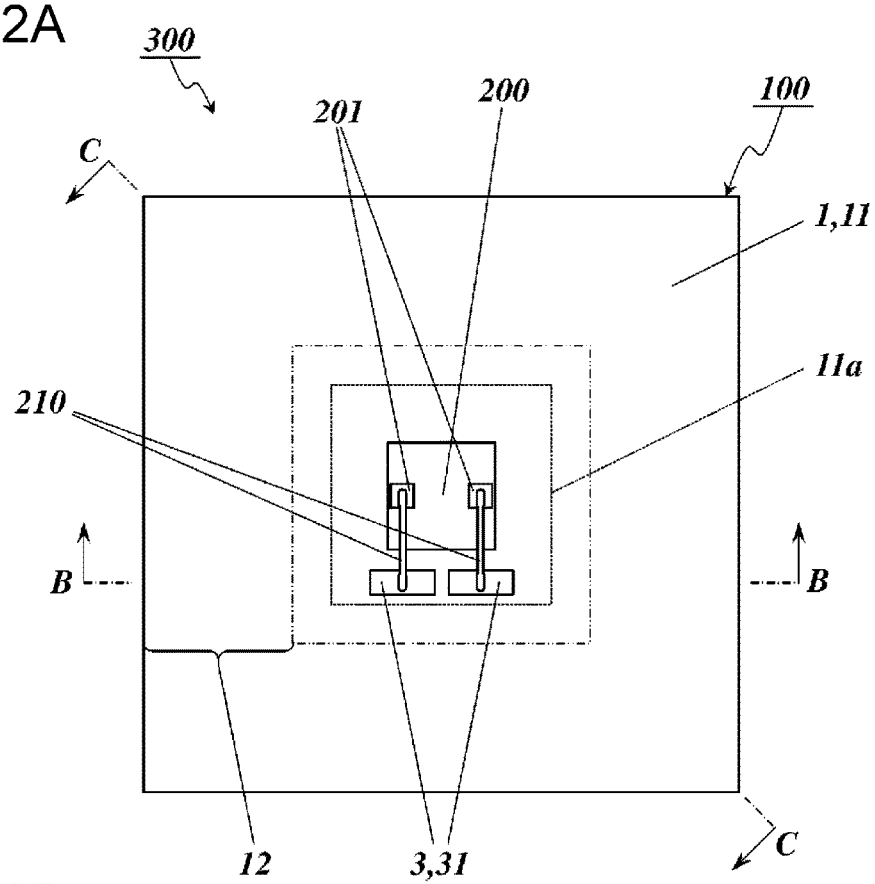
FIG. 2A is a plan view of the RFID tag illustrated in FIG. 1.
Figure 2B:
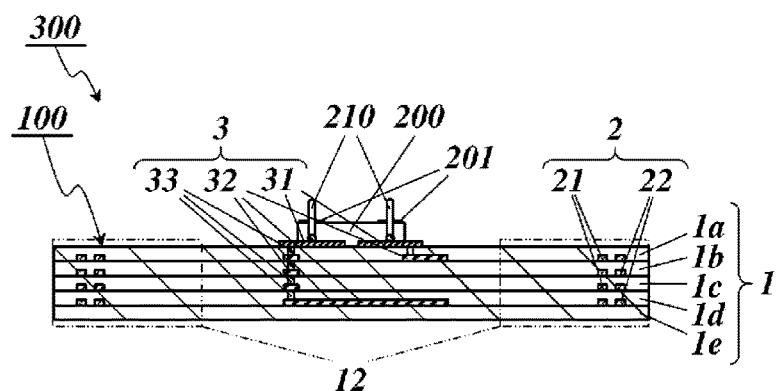
FIG. 2B is a sectional view taken along line B-B of FIG. 2A.
Figure 2C:
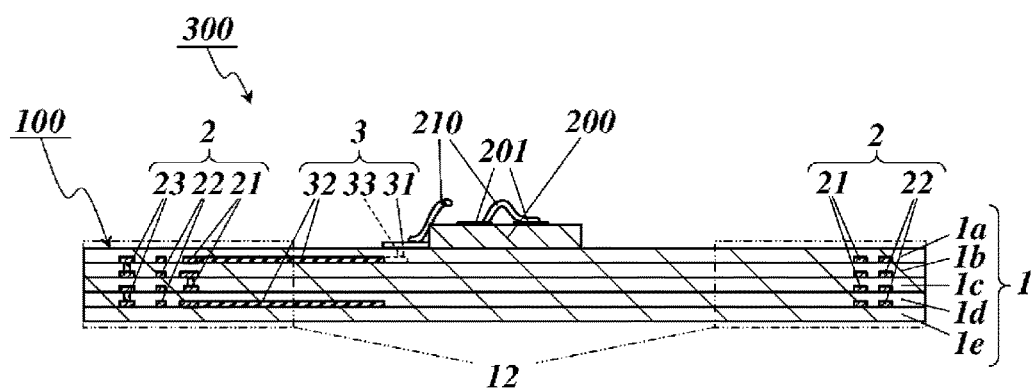
FIG. 2C is a sectional view taken along line C-C of FIG. 2A.
Figure 3:
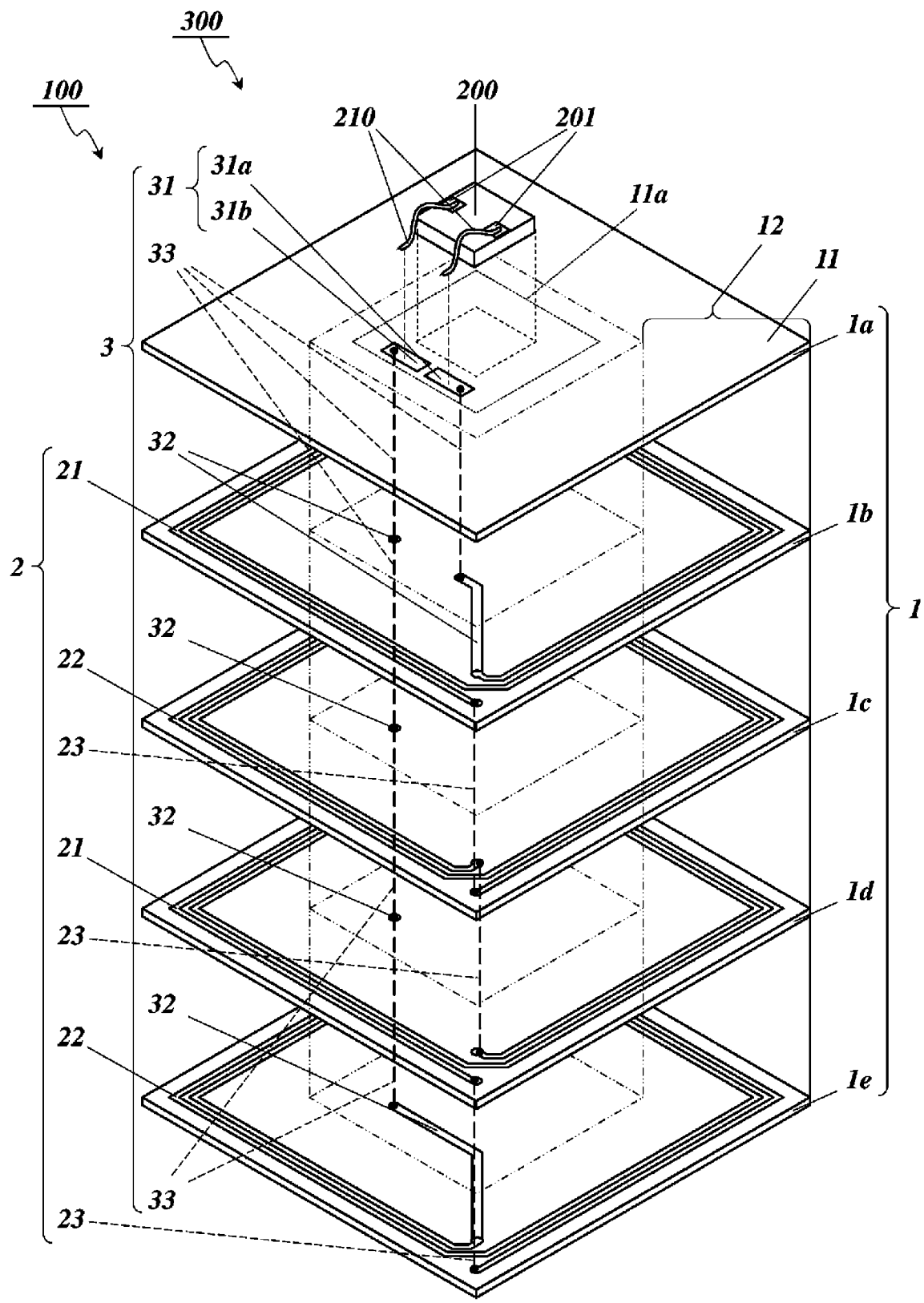
FIG. 3 is an exploded perspective view of the RFID tag substrate and the RFID tag, which are illustrated in FIG. 1.
Figure 4:
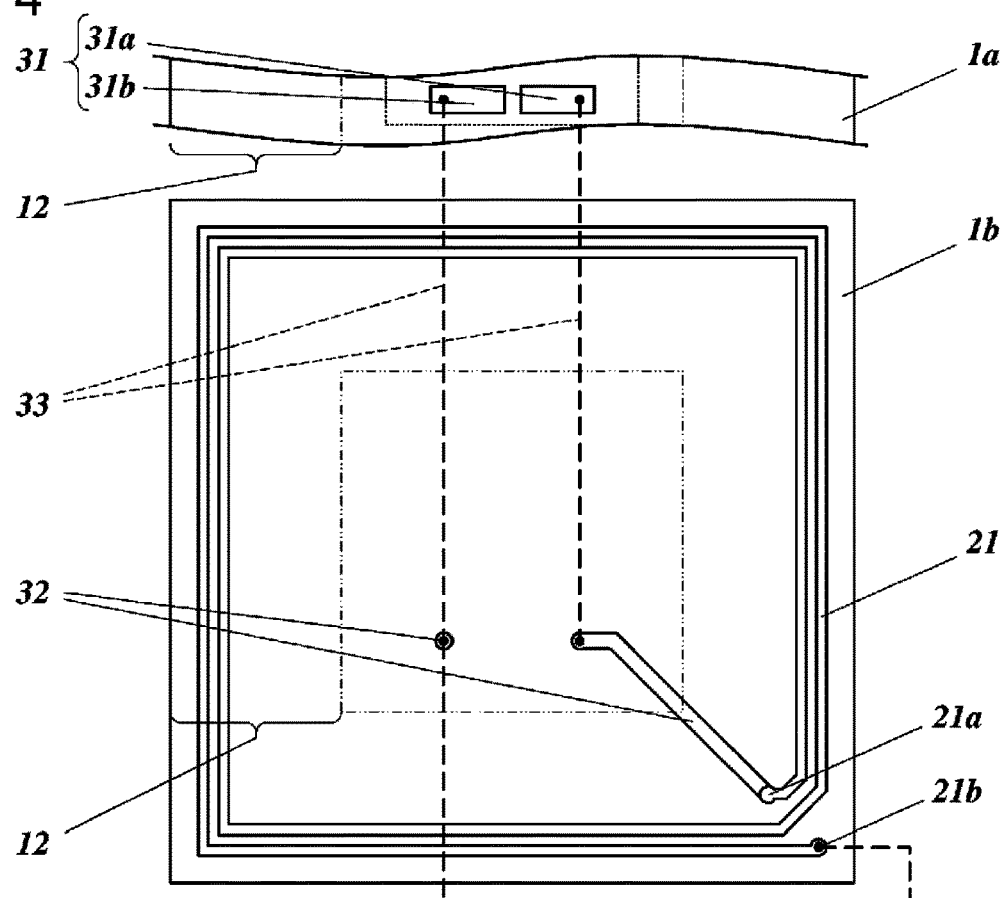
FIG. 4 is an exploded plan view illustrating a portion of the RFID tag substrate illustrated in FIG. 1.
Figure 4:
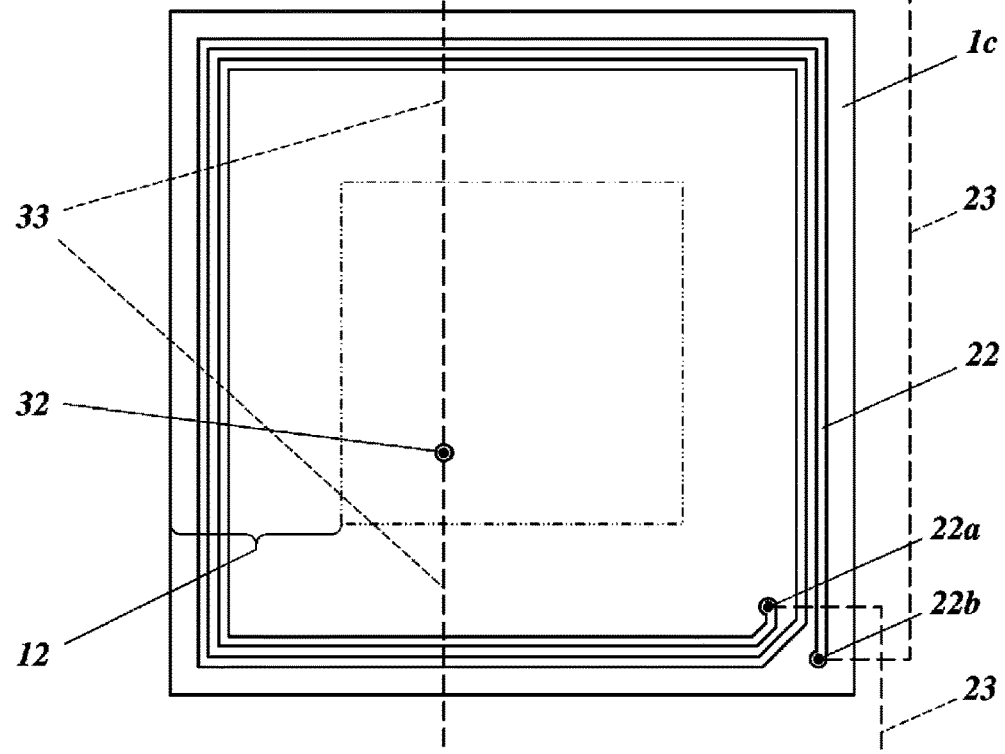
Figure 5:
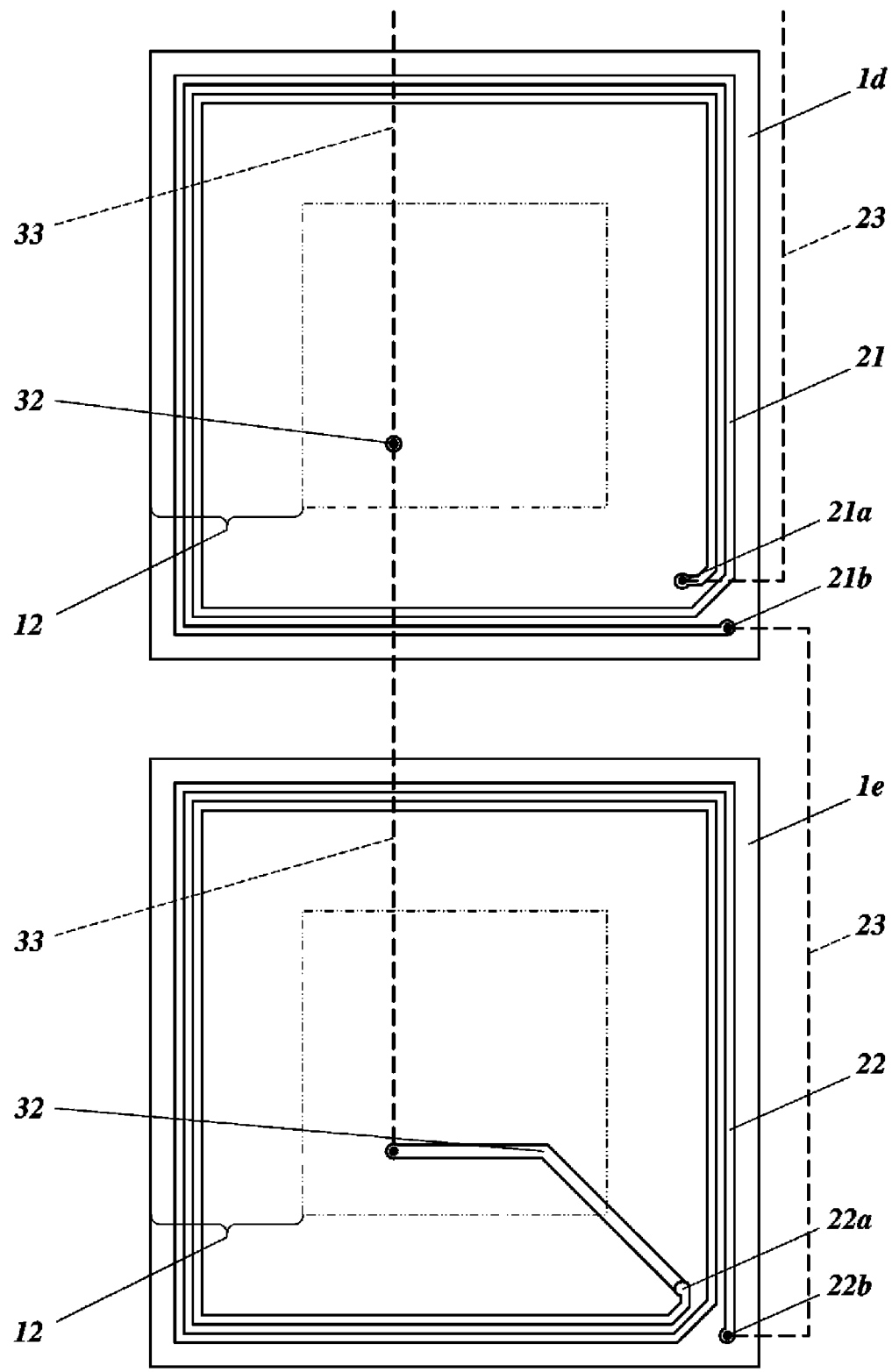
FIG. 5 is an exploded plan view illustrating a portion of the RFID tag substrate illustrated in FIG. 1.

An RFID tag substrate, an RFID tag, and an RFID system will be described with reference to the accompanying drawings. Note that the following description defines the top and the bottom for the sake of convenience and does not limit the top and the bottom when an RFID tag 300 is actually used. FIG. 1 is a perspective view illustrating an example of an RFID tag substrate and an example of an RFID tag. FIG. 2A is a plan view of the RFID tag illustrated in FIG. 1. FIG. 2B is a sectional view taken along line B-B of FIG. 2A. FIG. 2C is a sectional view taken along line C-C of FIG. 2A. FIG. 3 is an exploded perspective view of the RFID tag substrate and the RFID tag, which are illustrated in FIG. 1. FIG. 4 is an exploded plan view illustrating a portion of the RFID tag substrate illustrated in FIG. 1. FIG. 5 is an exploded plan view illustrating a portion of the RFID tag substrate illustrated in FIG. 1. Note that, in FIG. 3, which is the exploded perspective view, and FIG. 4 and FIG. 5, which are the plan views, coil-connecting conductors and through conductors of a wiring conductor are each indicated by a long dashed line having black circles at the two ends thereof that correspond to connecting portions.

In an RFID tag of the related art, in the case where a coil conductor is arranged from an outer edge portion of an insulating substrate to a center portion of the insulating substrate such that the inner diameter thereof is small, the Q value is likely to decrease, and the communication range is likely to become short. In an RFID tag of the related art that includes a large number of coil conductors having different shapes, such as coil conductors having different inner diameters, the coil conductors are manufactured by using various printing plates, masks, and so forth, and thus, variations in communication characteristics between a plurality of substrates may sometimes become large due to variations in the dimensions of the coil conductors. Along with the demands for reducing the sizes of RFID tags, RFID tag substrates also need to be reduced in size, and in the case of an RFID tag substrate of the related art, if it is reduced in size, communication characteristics such as those mentioned above are particularly more likely to deteriorate.

An RFID tag substrate 100 of the present disclosure includes an insulating substrate 1 that has a first surface 11 including a mounting region 11*a* in which a semiconductor device 200 is disposed and a coil 2 that is positioned at an outer edge portion 12 of the insulating substrate 1. The coil 2 includes a plurality of first coil conductors 21 and a plurality of second coil conductors 22. The number of turns of each of the second coil conductors 22 is the same as that of each of the first coil conductors 21, and the second coil conductors 22 are wound in a direction opposite to the direction in which the first coil conductors 21 are wound. The first coil conductors 21 and the second coil conductors 22 are alternately arranged in a thickness direction of the insulating substrate 1 and are connected in series to one another.

According to the RFID tag substrate 100 having such a configuration, since the coil 2 is positioned at the outer edge portion 12 of the insulating substrate 1, an internal dimension (the inner diameter) of the coil 2 is large, and a magnetic flux may easily pass through the inside of the coil 2, so that the Q value increases, and the communication range becomes long.

The outer edge portion 12 is a frame-shaped portion that extends along the outer sides of the first surface 11 of the insulating substrate 1 (the side surfaces of the insulating substrate 1) in the plan view. The inner edge of the outer edge portion 12 is indicated by a two-dot chain line in the plan views including FIG. 2A, and a portion outside the two-dot chain line is the outer edge portion 12. A portion inside the two-dot chain line is a center portion, and the center portion is surrounded by the outer edge portion 12. The two-dot chain line is the boundary line between the outer edge portion 12 and the center portion. In addition, in the sectional views including FIG. 2B and FIG. 2C, two portions that are surrounded by two-dot chain lines are each the outer edge portion 12, and the center portion is the portion sandwiched between the two outer edge portions 12.

In the outer edge portion 12, the coil 2 (the first coil conductors 21 and the second coil conductors 22) is wound along the outer edges (the side surfaces) in such a manner as to surround the center portion in the perspective plan view while the center portion serves as the center of winding of the coil 2. The center portion of the first surface 11 of the insulating substrate 1 has the mounting region 11*a* for the semiconductor device 200, and in the case illustrated in FIG. 1 to FIG. 5, the mounting region 11*a* is indicated by a dotted line. The first surface 11 is the outer surface of the insulating substrate 1, and for example, in the case illustrated in FIG. 1 to FIG. 5, the first surface 11 is a main surface extending in a direction crossing a direction in which insulating layers 1*a* to 1*e* are stacked on top of one another (the thickness direction of the insulating substrate 1). The mounting region 11*a* does not need to be positioned at the center portion, and in the case where (a portion of) the coil 2 is not positioned at the first surface 11, the mounting region 11*a* may be positioned at the outer edge portion 12.

The shape of the insulating substrate 1 in the plan view is a quadrangular shape and is a square shape or a rectangular shape. The term "quadrangular shape" includes a shape that is not an exact quadrangular shape and that is formed by, for example, rounding a corner of a quadrangular shape. The outer edge portion 12 is a portion that extends inward from the outer sides of the first surface 11 (the side surfaces of the insulating substrate 1) so as to have a width that is about 10% to about 25% of the length of one side of the first surface 11. In the case where the shape of the insulating substrate 1 in the plan view is a rectangular shape, the outer edge portion 12 is a portion having a width that is about 10% to about 25% of the length of a short side of the insulating substrate 1.

In the case illustrated in FIG. 2A to FIG. 2C, the two-dot chain line is illustrated at a position that is spaced apart inwardly from the outer sides of the first surface 11 (the side surfaces of the insulating substrate 1) by a distance that is 25% of the length of one side of the first surface 11. However, the first coil conductors 21 and the second coil conductors 22 are arranged in a region that extends inward from the side surfaces of the insulating substrate 1 so as to have a width that is 8.5% of the length of one side of the first surface 11, and the substantial outer edge portion 12 is a portion having a width that is 8.5% or less of the length of the side. In the case where the coil 2 (the first coil conductors 21 and the second coil conductors 22) is positioned at the outer edge portion 12 having a width that is 10% or less of the length of one side of the first surface 11, even if the RFID tag substrate 100 is small in size, the internal dimension (the inner diameter) of the coil 2 (the first coil conductors 21 and the second coil conductors 22) is sufficiently large, and the Q value is large.

Regarding a reduction in the size of the RFID tag substrate 100, importance is attached to a reduction in the size of the RFID tag substrate 100 in the plan view, and thus, the width of the outer edge portion 12 is also reduced. Considering an insulating property and a strength, it is necessary to keep a certain distance between the coil 2 (the first coil conductors 21 and the second coil conductors 22) and the side surfaces of the insulating substrate 1. Thus, in the outer edge portion 12, the width of a region in which the coil 2 (the first coil conductors 21 and the second coil conductors 22) can be arranged becomes smaller.

If the line width of each of the first and second coil conductors 21 and 22 is too small, the resistance increases, and the Q value decreases. Thus, the line width of each of the first and second coil conductors 21 and 22 needs to be reasonably large. In addition, in each of the first and second coil conductors 21 and 22, the gap between an inner conductor and an outer conductor also needs to be reasonably large. Although this gap is set to be as small as possible in order to increase the internal dimension, it is necessary to form a gap that does not cause a short-circuit between the conductors. Thus, in the outer edge portion 12 having a small width, the number of turns of the first coil conductors 21 and the number of turns of the second coil conductors 22 can be set small. More specifically, the number of turns of the first coil conductors 21 and the number of turns of the second coil conductors 22 can each be three turns or less (a single turn to three turns).

The coil 2 has a function of serving as an antenna that is caused to generate an induced current by a magnetic flux generated along with radio waves that are transmitted from an external device such as a reader-writer 400 of an RFID system 500. In addition, the coil 2 is an inductor and requires an inductor length (a conductor length) for obtaining an inductance in accordance with frequency. Each of the first and second coil conductors 21 and 22 has a small number of turns and a short conductor length, and thus, by arranging the plurality of first coil conductors 21 and the plurality of second coil conductors 22 in the thickness direction of the insulating substrate 1 and connecting them in series to one another, the necessary inductor length can be obtained. Here, the number of turns of each of the first coil conductors 21 is the same as that of each of the second coil conductors 22. Thus, in the outer edge portion 12 having a small width, both the first coil conductors 21 and the second coil conductors 22 can have the same maximum number of turns (inductor length). As a result, the number of the first coil conductors 21, the number of the second coil conductors 22, and the number of the insulating layers stacked on top of one another, that is, the thickness of the RFID tag substrate 100 can be prevented from becoming too large.

With such a configuration, the RFID tag substrate 100 can be obtained in which the coil 2 that includes the first and second coil conductors 21 and 22 each of which is wound with two turns is positioned at the outer edge portion 12 having a width that is 10% or less of the length of one side of the first surface 11. As a result, the internal dimension of the coil 2 is sufficiently large, and the resistance becomes low, so that the RFID tag substrate 100 that has a large Q value and a small thickness can be obtained.

The winding direction of the first coil conductors 21 and the winding direction of the second coil conductors 22 are opposite to each other, and the first coil conductors 21 and the second coil conductors 22 are alternately arranged in the thickness direction of the insulating substrate 1. In addition, as in the case illustrated in FIG. 3 to FIG. 5, each of the first coil conductors 21 and one of the second coil conductors 22 that is adjacent to the first coil conductor 21 in the thickness direction of the insulating substrate 1 are connected to each other at their inner end portions 21$a$ and 22$a$ or their outer end portions 21$b$ and 22$b$. With such a configuration, in the coil 2, the plurality of first coil conductors 21 and the plurality of second coil conductors 22 that are alternately arranged are connected in series even if each of the first and second coil conductors 21 and 22 has a plurality of turns. The first coil conductors 21 and the second coil conductors 22 are connected to one another by coil-connecting conductors 23, which are through conductors that extend through the insulating layers located between these coil conductors. In the coil 2 having such a configuration, the direction of a current that flows into the first coil conductors 21 and the direction of a current that flows into the second coil conductors 22 are the same as each other. As a result, the coil 2 can generate a large magnetic flux therearound. The first coil conductors 21 and the second coil conductors 22 are connected to one another by the coil-connecting conductors 23, which are through conductors that extend through the insulating layers located between these coil conductors.

In the case of causing a coil to have a high inductance by connecting a plurality of coil conductors each having a plurality of turns, if the winding directions of the plurality of coil conductors are the same, it is necessary to provide a wiring layer for connecting the coil conductors that are adjacent to each other in the thickness direction of the insulating substrate 1. This is because, in order to connect the adjacent coil conductors to each other, it is necessary to connect an inner end portion and an outer end portion, and these end portions need to be connected to each other by a conductor (the wiring layer) extending in a surface direction of an insulating layer. In order to prevent this wiring layer from causing a short-circuit between the upper and lower coil conductors, an insulating layer needs to be provided between the wiring layer and each of the upper and lower coil conductors. It is necessary to provide at least two insulating layers between the upper and lower coil conductors and to dispose a wiring layer between these insulating layers. The wiring layer, which is disposed between the insulating layers, and the upper coil conductor are connected to each other by a through conductor extending through the upper insulating layer, and the wiring layer and the lower coil conductor are connected to each other by a through conductor extending through the lower insulating layer.

In the RFID tag substrate 100 of the present disclosure, the first coil conductors 21 and the second coil conductors 22, which are wound in the direction opposite to the direction in which the first coil conductors 21 are wound, are alternately arranged. Thus, one of the first coil conductors 21 and one of the second coil conductors 22 that are vertically adjacent to each other can be connected to each other only by one of the coil-connecting conductors 23, the coil-connecting conductor 23 extending through a corresponding one of the insulating layers 1$a$ to 1$d$ that is located between the first coil conductor 21 and the second coil conductor 22. Therefore, the RFID tag substrate 100 that is thin even if the coil 2 has a large number of turns can be obtained.

Note that, when the winding directions are opposite to each other, the winding directions are opposite to each other in the perspective plan view, and for example, in the case illustrated in FIG. 1 to FIG. 5, the winding direction of the first coil conductors 21 is a rightward direction (clockwise), and the winding direction of the second coil conductors 22 is a leftward direction (counterclockwise). It can also be said that the winding directions are opposite to each other if viewed from connection points (the inner end portions 21$a$ and 22$a$ or the outer end portions 21$b$ and 22$b$) of one of the first coil conductors 21 and one of the second coil conductors 22 that are vertically adjacent to each other. In the case illustrated in FIG. 1 to FIG. 5, each of the first coil conductors 21 is wound inward starting from the outer end portion 21$b$ in the clockwise direction. Each of the second coil conductors 22 is wound inward starting from the outer end portion 22$b$ in the counterclockwise direction. To put it another way, one of the first coil conductors 21 is wound with two turns in the counterclockwise direction from the inner end portion 21$a$ to the outer end portion 21$b$ in such a manner that the second turn is larger than the first turn. One of the second coil conductors 22 that is positioned below the first coil conductor 21 is wound with two turns in the counterclockwise direction from the outer end portion 22$b$ that is connected to the outer end portion 21$b$ of the first coil conductor 21 (by the corresponding coil-connecting conductor 23) to the inner end portion 22$a$ in such a manner that the second turn is smaller than the first turn. Another one of the first coil conductors 21 that is positioned below the second coil conductor 22 is wound with two turns in the counterclockwise direction from the inner end portion 21$a$ that is connected to the inner end portion 22$a$ of the second coil conductor 22 to the outer end portion 21$b$ in such a manner that the second turn is larger than the first turn.

In addition, a large portion of the coil 2 is formed of two conductor patterns, which are the first coil conductors 21 and the second coil conductors 22, and thus, the large portion of the coil 2 can be formed by using only two types of printing plates or masks that are used for forming the coil 2. Printing plates are used if, for example, the coil 2 (the first coil conductors 21 and the second coil conductors 22) is formed by printing a conductor paste. Masks are used if, for example, the coil 2 (the first coil conductors 21 and the second coil conductors 22) is formed by etching a copper foil. In contrast, a coil of the related art that includes various coil conductors needs to be manufactured by using various printing plates and the like. Compared with such a case, variations in the dimensions of coil conductor patterns are smaller in the case where a plurality of coil conductors are formed by using the same printing plate or the like, and thus, variations in the communication characteristics between a plurality of RFID tag substrates 100 are small. In addition, the manufacturing costs can be kept low because, for example, the number of printing plates or the like is small. Therefore, the RFID tag substrate 100 that is favorable in terms of mass production may be obtained.

In the case illustrated in FIG. 1 to FIG. 5, the coil 2 includes the first coil conductors 21, the second coil conductors 22, and the coil-connecting conductors 23, which connect the first coil conductors 21 and the second coil conductors 22 to each other. The two first coil conductors 21 and the two second coil conductors 22 are all arranged between the insulating layers, and the coil 2 is disposed inside the insulating substrate 1. The insulating substrate 1 in this case includes the five the insulating layers, which are the insulating layer 1a, the insulating layer 1b, the insulating layer 1c, the insulating layer 1d, and the insulating layer 1e, that are stacked on top of one another in this order from the top. The top surface of the uppermost insulating layer 1a is the first surface 11 of the insulating substrate 1. One of the first coil conductors 21 is provided between the insulating layer 1a and the insulating layer 1b, which is positioned below the insulating layer 1a, and one of the second coil conductors 22 is provided between the insulating layer 1b and the insulating layer 1c, which is positioned below the insulating layer 1b. The outer end portion 21b of the first coil conductor 21 and the outer end portion 22b of the second coil conductor 22 are connected to each other by one of the coil-connecting conductors 23 that extends through the insulating layer 1b. In addition, another one of the first coil conductors 21 is provided between the insulating layer 1c and the insulating layer 1d, which is positioned below the insulating layer 1c, and the inner end portion 21a of this first coil conductor 21 and the inner end portion 22a of the second coil conductor 22, which is positioned above the first coil conductor 21, are connected to each other by one of the coil-connecting conductors 23 that extends through the insulating layer 1c. Furthermore, another one of the second coil conductors 22 is provided between the insulating layer 1d and the insulating layer 1e, which is positioned below the insulating layer 1d, and the outer end portion 22b of this second coil conductor 22 and the outer end portion 21b of the first coil conductor 21, which is positioned above the second coil conductor 22, are connected to each other by one of the coil-connecting conductors 23 that extends through the insulating layer 1e. Note that, in the case illustrated in FIG. 1 to FIG. 5, although the end portions 21a and 21b of the first coil conductors 21 and the end portions 22a and 22b of the second coil conductors 22 are each formed in the shape of a wide pad in order to improve the connectivity with the coil-connecting conductors 23 or through conductors 33, each of these end portions may have a width the same as that of each of the other portions instead of having the shape of a wide pad.

The RFID tag substrate 100 in the case illustrated in FIG. 1 to FIG. 5 has the mounting region 11a in which the semiconductor device 200 is disposed, and the mounting region 11a is formed in the center portion of the first surface 11 of the insulating substrate 1 (a center portion of the top surface of the uppermost insulating layer 1a). As a wiring conductor 3 that is to be electrically connected to the semiconductor device 200, two connection pads 31 (31a and 31b) are provided in the mounting region 11a. In this case, terminal electrodes 201 of the semiconductor device 200 and the connection pads 31 are electrically connected to each other with bonding wires serving as connecting members 210. The two connection pads 31 are each electrically connected to an end portion of the coil 2. The connection pad 31a is connected to the inner end portion 21a of the first coil conductor 21 that is disposed between the insulating layers 1a and 1b by one of the through conductors 33 that extends through the insulating layer 1a and one of wiring layers 32 that is provided between the insulating layer 1a, which is positioned immediately below the connection pad 31a, and the insulating layer 1b and that extends from the outer edge portion 12 to the center portion. The connection pad 31b is connected to the inner end portion 22a of the second coil conductor 22 that is disposed between the insulating layers 1d and 1e by the through conductors 33 that extend through the insulating layer 1a, 1b, 1c, and 1d, the wiring layers 32 that are provided between the insulating layers 1a to 1e, and the wiring layer 32 that is provided between the insulating layer 1d and the lowermost insulating layer 1e and that extends from the outer edge portion 12 to the center portion. The wiring layer 32 that is sandwiched between the through conductors 33 and 33 in the vertical direction is provided for improving the electrical connection reliability between the through conductors 33 and may be omitted.

FIG. 6 to FIG. 8, FIG. 10, and FIG. 11 are each the exploded perspective view illustrating another example of the RFID tag substrate. FIG. 9 is the plan view illustrating a portion of the RFID tag substrate illustrated in FIG. 8. More specifically, FIG. 9 is the exploded plan view illustrating a third coil conductor 211 that is provided on the insulating layer 1b and another third coil conductor 221 that is provided on an insulating layer 1g. Note that, also in the exploded perspective views and the plan view, coil-connecting conductors and through conductors of a wiring conductor are each indicated by a long dashed line having black circles at the two ends thereof that correspond to connecting portions.

Figure 6:
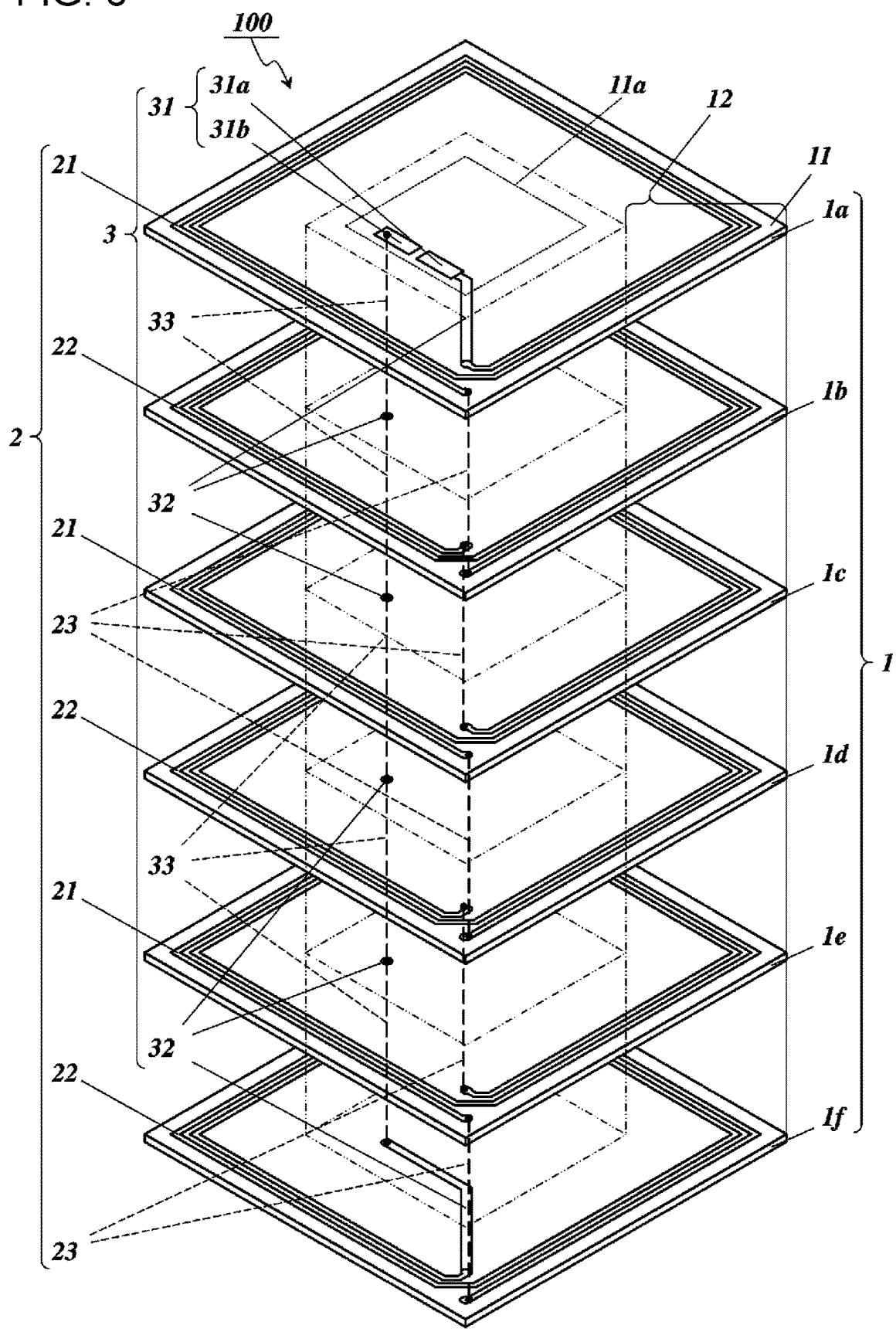
FIG. 6 is an exploded perspective view illustrating another example of the RFID tag substrate.

The differences between the RFID tag substrate 100 in the case illustrated in FIG. 6 and the RFID tag substrate 100 illustrated in FIG. 1 to FIG. 5 are the number of insulating layers and the configuration of the coil 2. The coil 2 illustrated in FIG. 6 includes three first coil conductors 21, three second coil conductors 22, and the coil-connecting conductors 23, which connect the first coil conductors 21 and the second coil conductors 22 to each other. One of the first coil conductors 21 is provided on the first surface 11 of the insulating substrate 1 (the top surface of the uppermost insulating layer 1a) like the connection pads 31 (31a and 31b), and the other two second coil conductors 22 and the three second coil conductors 22 are arranged between the insulating layers. In other words, the coil 2 is disposed so as to extend inside the insulating substrate 1 from a surface of the insulating substrate 1 (the first surface 11). In addition, one of the wiring layers 32 that connects the connection pad 31 (31a) and the inner end portion 21a of the uppermost first coil conductor 21 to each other is also provided on the first surface 11 of the insulating substrate 1 (the top surface of the uppermost insulating layer 1a) like the connection pads 31 (31a and 31b).

Figure 7:
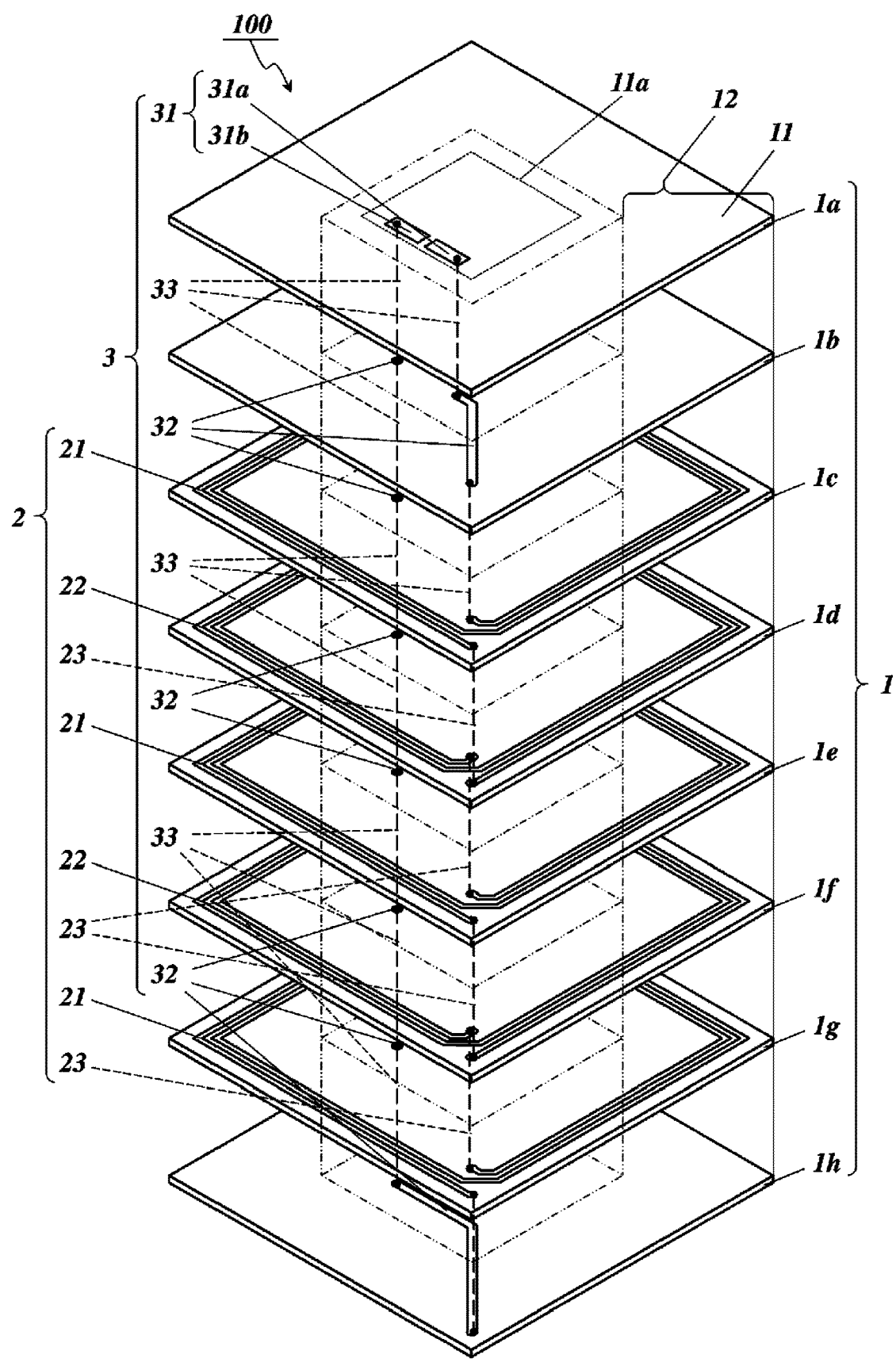
FIG. 7 is an exploded perspective view illustrating another example of the RFID tag substrate.

In the RFID tag substrate 100 in the case illustrated in FIG. 7, the coil 2 includes three first coil conductors 21, two second coil conductors 22, and the coil-connecting conductors 23, which connect the first coil conductors 21 and the second coil conductors 22 to each other. In the coil 2 in the case illustrated in FIG. 1 to FIG. 5, the number of coil conductors (the sum of the number of the first coil conductors 21 and the number of the second coil conductors 22) is four, which is an even number, and in the coil 2 in the case illustrated in FIG. 6, the number of coil conductors (the first coil conductors 21 and the second coil conductors 22) is six, which is an even number. In contrast, in the coil 2 in the case illustrated in FIG. 7, the number of coil conductors (the first coil conductors 21 and the second coil conductors 22) is five, which is an odd number. If the number of coil conductors is an odd number, if the lowermost coil conductor (first coil conductor 21) and the wiring layer 32 that is routed to a center portion in order to connect the lowermost coil conductor to the connection pad 31 (31b) are both arranged between an insulating layer 1f and the insulating layer 1g, the lowermost coil conductor and the wiring layer 32 intersect each other. Alternatively, the wiring layer 32 needs to be routed in a narrow space between portions of the coil conductor (first coil conductor 21), and it is difficult to perform such routing. In the case illustrated in FIG. 7, the insulating layers between which the lowermost first coil conductor 21 is positioned are different from the insulating layers between which the wiring layer 32, which is connected to the first coil conductor 21, is positioned. The lowermost first coil conductor 21 is positioned between the insulating layers 1f and 1g, and the wiring layer 32 is positioned between the insulating layer 1g and an insulating layer 1h so as to be located below the lowermost first coil conductor 21. Thus, even if the number of coil conductors included in the coil 2 is an odd number, the lowermost coil conductor (first coil conductor 21) may be easily connected to the connection pad 31b by the wiring layer 32. Therefore, the number of the first coil conductors 21 and the number of the second coil conductors 22 that are included in the coil 2 are not limited, and the degree of freedom if setting the inductor length of the coil 2 is large.

In the case illustrated in FIG. 7, the insulating layers between which the uppermost first coil conductor 21 is positioned are different from the insulating layers between which the wiring layer 32, which is connected to the uppermost first coil conductor 21, is positioned. As a result, the conductor patterns of the insulating layers 1c, 1e, and 1g on which the first coil conductors 21 are positioned are the same as one another and can be formed by using a single printing plate or the like. In the case where a coil conductor and the wiring layer 32 that is connected to the coil conductor are positioned between the same insulating layers, for example, one of the first coil conductors 21 and the wiring layer 32 that is connected to this first coil conductor 21 are formed on the insulating layer 1b illustrated in FIG. 3. If the one first coil conductor 21 and the wiring layer 32 connected to the one first coil conductor 21 are formed by using a single printing plate or the like, the printing plate is different from the printing plate that is used for forming the first coil conductor 21 or the like on the insulating layer 1d. Alternatively, the first coil conductor 21 and the wiring layer 32 that is connected to the first coil conductor 21 are formed on the insulating layer 1b by two separate operations using a printing plate for the first coil conductor 21 and a printing plate for the wiring layer 32 that is connected to the first coil conductor 21.

In the RFID tag substrate 100 illustrated in FIG. 7, the wiring layer 32 that is positioned between the insulating layers 1a and 1b can be provided on the insulating layer 1a. In this case, the insulating layer 1b can be removed, and the wiring layer 32 is directly connected to the connection pad 31a on the first surface 11 of the insulating substrate 1. In addition, the wiring layer 32 that is positioned between the insulating layers 1g and 1h can be provided on the bottom surface of the insulating layer 1g. In this case, the insulating layer 1h can be removed, and the wiring layer 32 is located on a surface (the bottom surface) of the insulating substrate 1, the surface being opposite to the first surface 11. The thickness of the RFID tag substrate 100 can be reduced by reducing the number of insulating layers. In addition, the through conductors 33 that connect the connection pad 31a to the wiring layers 32 can also be removed, and thus, the resistance of the coil 2 can be further reduced, so that the Q value of the RFID tag substrate 100 can be further increased.

Figure 8:
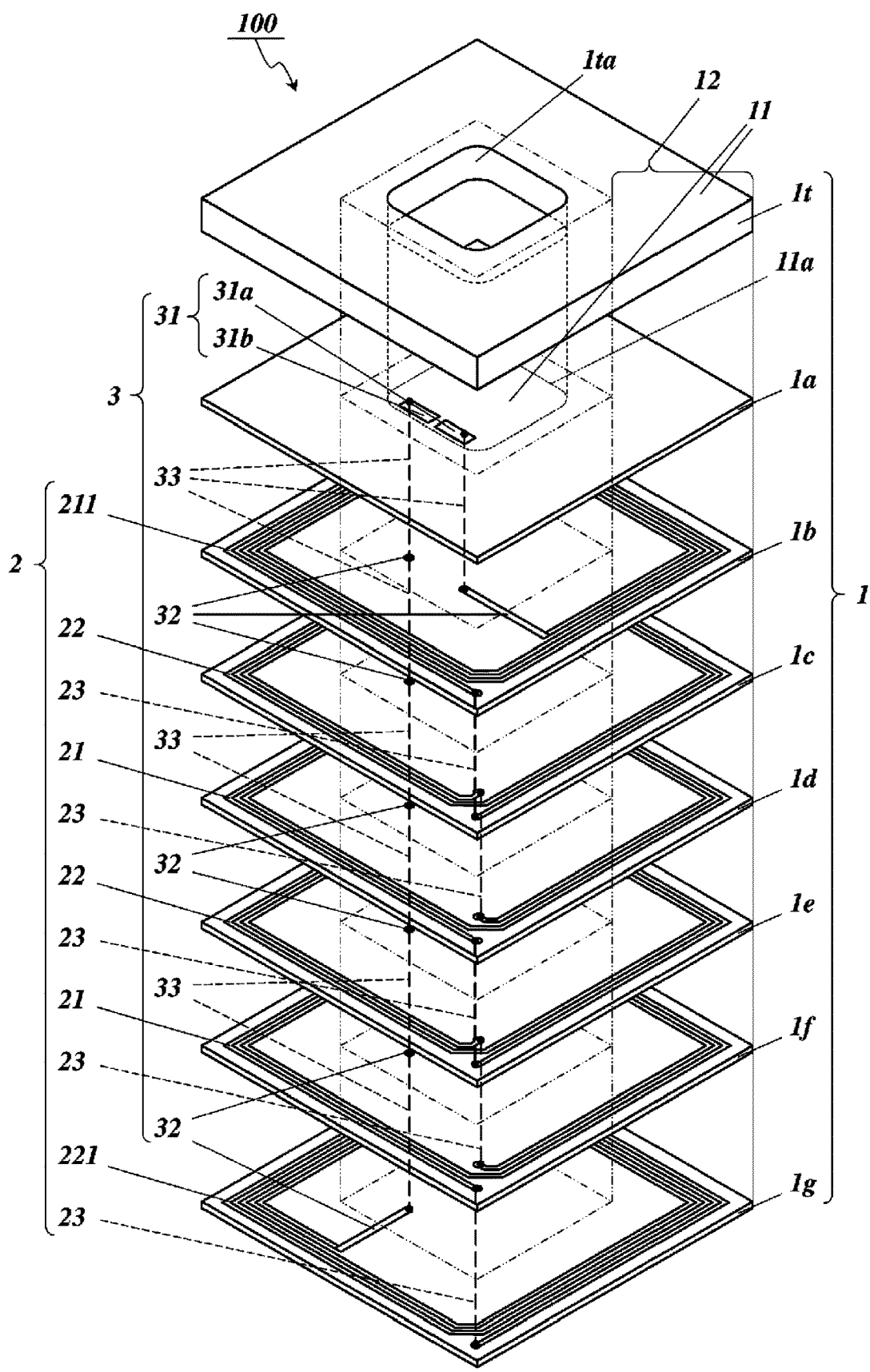
FIG. 8 is an exploded perspective view illustrating another example of the RFID tag substrate.
Figure 9:
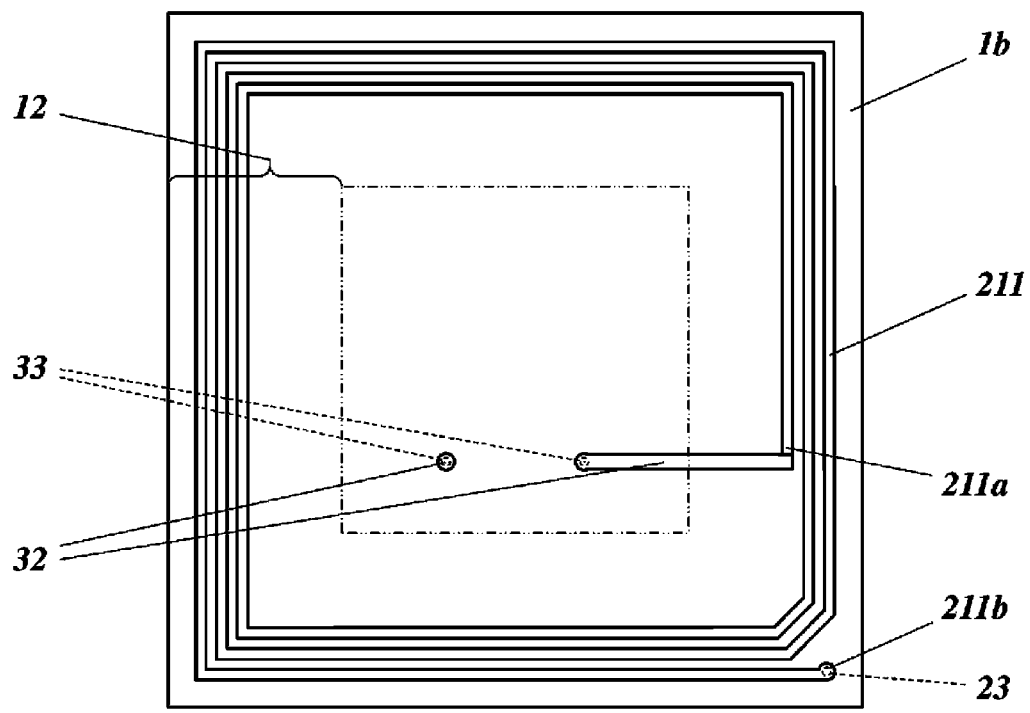
FIG. 9 is a plan view illustrating a portion of the RFID tag substrate illustrated in FIG. 8.
Figure 9:
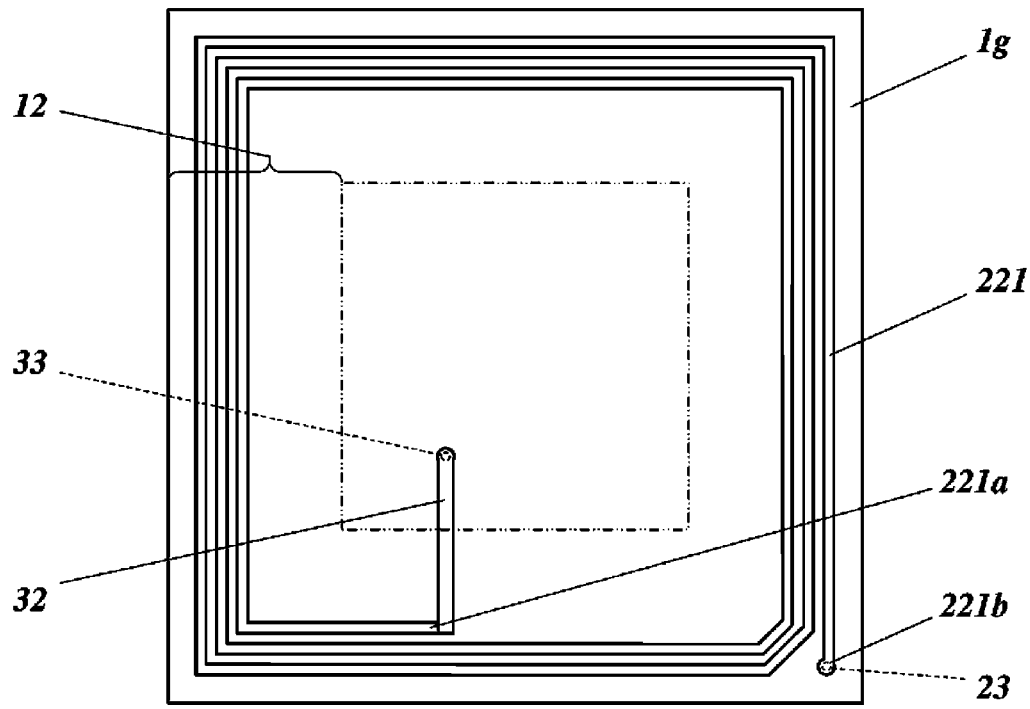

In the RFID tag substrate 100 in the case illustrated in FIG. 8, the coil 2 includes two first coil conductors 21 and two second coil conductors 22. One of the second coil conductors 22 is closest to the first surface 11, and the second coil conductors 22 and the first coil conductors 21 form a center portion of the coil 2 by being alternately arranged. The third coil conductor 211 and the third coil conductor 221 are respectively positioned on the upper side and the lower side of the center portion of the coil 2 and connected to the center portion of the coil 2 by the coil-connecting conductors 23. In other words, the coil 2 includes the third coil conductor 211 positioned at an upper end portion thereof and the third coil conductor 221 positioned at a lower end portion thereof. As illustrated in FIG. 9, the third coil conductor 211 on the upper side has a shape obtained by extending the first coil conductor 21 illustrated in FIG. 4 and FIG. 5 inward by about 0.92 turns so as to have a larger number of turns than the first coil conductor 21. The third coil conductor 221 on the lower side has a shape obtained by extending the second coil conductor 22 illustrated in FIG. 4 and FIG. 5 inward by about 0.84 turns so as to have a larger number of turns than the second coil conductor 22. The third coil conductor 211 has a conductor length longer than that of each of the first coil conductors 21, and the third coil conductor 221 has a conductor length longer than that of each of the second coil conductors 22. The winding direction of the third coil conductor 211 is the same as the winding direction of the first coil conductors 21 and opposite to the winding direction of the second coil conductor 22 to which the third coil conductor 211 is connected. The winding direction of the third coil conductor 221 is the same as the winding direction of the second coil conductors 22 and opposite to the winding direction of the first coil conductor 21 to which the third coil conductor 221 is connected. If the coil 2 is seen as a whole, similar to a coil that does not include the third coil conductors 211 and 221, the coil conductors whose winding directions are opposite to each other are alternately arranged. Thus, each pair of the coil conductors (including the first coil conductors 21, the second coil conductors 22, and the third coil conductors 211 and 221) that are vertically adjacent to each other can be connected to each other only by one of the coil-connecting conductors 23, the coil-connecting conductor 23 extending through one of the insulating layers 1a to 1e that is positioned between the pair of coil conductors. Therefore, the RFID tag substrate 100 that is thin even if the coil 2 has a large number of turns can be obtained.

The RFID tag substrate 100 in the case illustrated in FIG. 8 includes a frame-shaped insulating layer 1t having a through hole 1ta, and the frame-shaped insulating layer 1t is disposed on the insulating layer 1a that is provided with the connection pads 31 (31a and 31b) arranged on the top surface thereof and whose top surface has the mounting region 11a for the semiconductor device 200. The through hole 1ta is formed in a center portion of the frame-shaped insulating layer 1t, and the frame-shaped insulating layer 1t surrounds the mounting region 11a in the plan view. The frame-shaped insulating layer 1t and the other insulating layers 1a to 1g are integrally formed into the insulating substrate 1. A main surface (the top surface) of the insulating substrate 1 has a recess that is formed by being surrounded by the frame-shaped insulating layer 1t and the top surface of the insulating layer 1a that is located in the through hole 1ta. The bottom surface of this recess is the mounting region 11a, and the connection pads 31 (31a and 31b) are located in the mounting region 11a. The recess serves as a cavity for accommodating the semiconductor device 200. If the thickness of the frame-shaped insulating layer 1t is thicker than that of the semiconductor device 200, it is effective in protecting the semiconductor device 200. The first surface 11 in this case serves as the top surface of the frame-shaped insulating layer 1t and the bottom surface of the recess.

Figure 10:
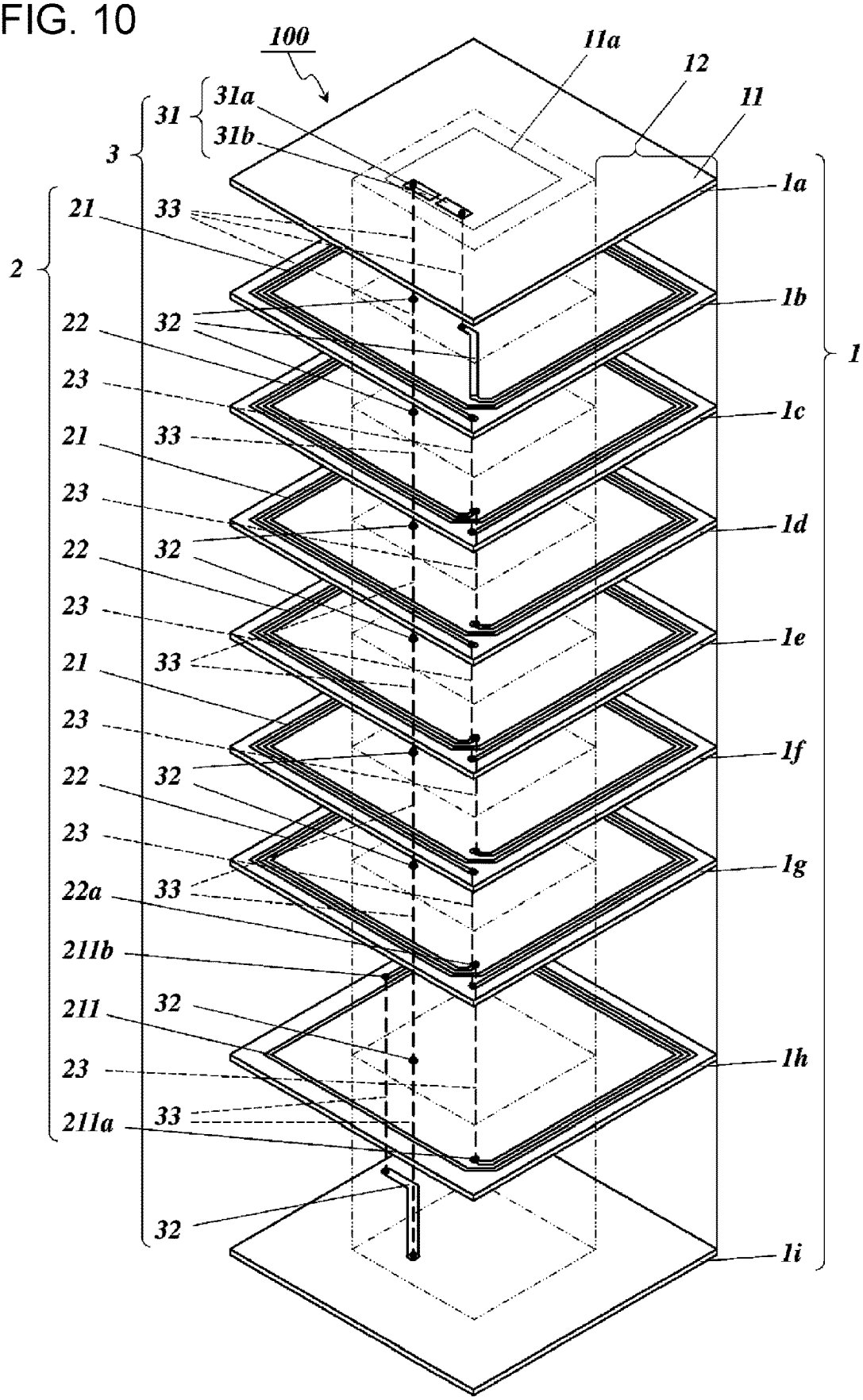
FIG. 10 is an exploded perspective view illustrating another example of the RFID tag substrate.

In the RFID tag substrate 100 in the case illustrated in FIG. 10, the coil 2 includes three first coil conductors 21, three second coil conductors 22, and a single third coil conductor 211. The first coil conductors 21 and the second coil conductors 22 are sequentially and alternately arranged starting from the side on which the first surface 11 is present (the upper side), and the third coil conductor 211 is positioned below these coil conductors. Each of the coil-connecting conductors 23 connects an adjacent two of the first to third coil conductors 21, 22, and 211. In other words, the coil 2 includes the third coil conductor 211 provided only at a lower end portion of the coil 2. The third coil conductor 221 has a shape obtained by cutting off an outer portion of one of the first coil conductors 21 by about 0.41 turns so as to have a smaller number of turns than the first coil conductor 21. In other words, the third coil conductor 211 in this case has a conductor length shorter than that of each of the first and second coil conductors 21 and 22. Although the configuration of the coil 2 in the case illustrated in FIG. 10 and the configuration of the coil 2 in the case illustrated in FIG. 8 are different from each other, the entire conductor length of the coil 2 in the case illustrated in FIG. 10 and the entire conductor length of the coil 2 in the case illustrated in FIG. 8 are the same as each other.

In addition, the winding direction of the third coil conductor 211 is the same as the winding direction of the first coil conductors 21 and opposite to the winding direction of the second coil conductor 22 that is positioned above the third coil conductor 211, which is positioned between the insulating layers 1g and 1h, and to which the third coil conductor 211 is connected. Also in this case, if the coil 2 is seen as a whole, the coil conductors whose winding directions are opposite to each other are alternately arranged. Thus, each pair of the coil conductors (including the first coil conductors 21, the second coil conductors 22, and the third coil conductors 211 and 221) that are vertically adjacent to each other can be connected to each other only by one of the coil-connecting conductors 23, the coil-connecting conductor 23 extending through one of the insulating layers 1b to 1g that is positioned between the pair of coil conductors.

Therefore, the RFID tag substrate 100 that is thin even if the coil 2 has a large number of turns can be obtained. In the RFID tag substrate 100 in the case illustrated in FIG. 10, an inner end portion 211a of the third coil conductor 211, which is the lowermost coil conductor in the coil 2, and the inner end portion 22a of the second coil conductor 22 that is positioned above the third coil conductor 211 are connected to each other by one of the coil-connecting conductors 23. In addition, an outer end portion 211b of the third coil conductor 211 and the connection pad 31 (31b) disposed on the center portion of the first surface 11 are connected to each other by one of the wiring layers 32. This wiring layers 32 is disposed at a position between the insulating layers 1h and 1i below the position of the third coil conductor 211, which is disposed between the insulating layers 1g and 1h, and has a shape extending from the outer edge portion 12 to the center portion. In addition, the first coil conductor 21, which is the uppermost coil conductor in the coil 2, and the connection pad 31 (31a) are connected to each other by another one of the wiring layers 32. This wiring layer 32 is positioned between the insulating layers 1a and 1b like the uppermost first coil conductor 21 and has a shape extending from the outer edge portion 12 to the center portion.

As in each of the cases illustrated in FIG. 8 to FIG. 10, the RFID tag substrate 100 can be obtained in which the third coil conductors 211 and 221, each of which has a conductor length different from that of each of the first and second coil conductors 21 and 22, are provided at at least one of the two end portions of the coil 2 in the thickness direction of the insulating substrate 1.

If the first coil conductors 21 and the second coil conductors 22 are alternately arranged and connected in series so as to form the coil 2, the conductor length of the coil 2 and the length of the inductor each become an integral multiple of the conductor length of each of the first and second coil conductors 21 and 22. The length of each of the coil conductors (the first coil conductors 21 and the second coil conductors 22) may be set by dividing the inductor length required for the coil 2 into equal lengths. However, as described above, the size (the diameter and the number of turns) of each of the coil conductors is set in accordance with the size of the RFID tag substrate 100 (the insulating substrate 1). Thus, it is not easy to design the coil 2 with the plurality of first and second coil conductors 21 and 22 having the same length. In the case where the RFID tag substrate 100 includes the third coil conductors 211 and 221, fine adjustments can be made to the entire length of the coil 2 (the length of the inductor) by adjusting the conductor length of each of the third coil conductors 211 and 221. The communication frequency of the RFID tag 300 can be set depending on the length of the inductor. Consequently, by including the third coil conductors 211 and 221 in the RFID tag substrate 100, a frequency adjustment can be performed with high accuracy, and thus, the RFID tag substrate 100 may be obtained by which the RFID tag 300 having better communication characteristics can be obtained.

Each of the third coil conductors 211 and 221 can have an external dimension the same as that of each of the first and second coil conductors 21 and 22. It is preferable to set a distance between the coil 2 (the first coil conductors 21 and the second coil conductors 22) and the side surfaces of the insulating substrate 1 in order to ensure an insulating property and a strength as mentioned above, and the internal dimensions of the coil conductors (the first coil conductors 21 and the second coil conductors 22) may be increased as much as possible. The same applies to the third coil conductors 211 and 221, and thus, the external dimension of each of the third coil conductors 211 and 221 may be the same as that of each of the first and second coil conductors 21 and 22. Similar to the first coil conductors 21 and the second coil conductors 22, if the line width of each of the third coil conductors 211 and 221 is too small, the resistance increases, and the Q value decreases. Thus, each of the third coil conductors 211 and 221 can have a line width the same as that of each of the first and second coil conductors 21 and 22.

The conductor length of the third coil conductors 211 and 221 is less than twice the conductor length of each of the first and second coil conductors 21 and 22. In the case where the third coil conductors 211 and 221 are arranged such that one of them is positioned at one of the two end portions of the coil 2 and the other is positioned at the other of the two end portions of the coil 2, the sum of the conductor lengths of the two third coil conductors 211 and 221 can be less than three times the conductor length of each of the first and second coil conductors 21 and 22. As mentioned above, the third coil conductors 211 and 221 are provided in order to make fine adjustments to the entire length of the coil 2 (the length of the inductor) by adjusting the conductor length the entire length of the coil 2 (the length of the inductor) if an inductor length that is an integral multiple of the conductor length of each of the first and second coil conductors 21 and 22 and that is required for the coil 2 is not obtained. Thus, for example, if the conductor length of one of the third coil conductors 211 and 221 is twice the conductor length of each of the first and second coil conductors 21 and 22, another first coil conductor 21 and another the second coil conductor 22 may be provided instead of the third coil conductors 211 and 221. In addition, for example, if the sum of the conductor lengths of the two third coil conductors 211 and 221 is three times the conductor length of each of the first and second coil conductors 21 and 22, two other first coil conductors 21 and another second coil conductor 22 may be provided instead of the third coil conductors 211 and 221. Alternatively, another first coil conductor 21 and two other second coil conductors 22 may be provided. With this configuration, the internal dimensions of the third coil conductors 211 and 221 will not become too small compared with the first coil conductors 21 and the second coil conductors 22, and the Q value of the coil 2 will not decrease.

In addition, the conductor length of each of the third coil conductors 211 and 221 is longer than the conductor length of each of the first and second coil conductors 21 and 22, the number of turns of each of the third coil conductors 211 and 221 can be equal to or less than a number that is obtained by adding one turn to the number of turns of each of the first and second coil conductors 21 and 22. As a result, the internal dimensions of the third coil conductors 211 and 221 can be increased as much as possible. Even if the internal dimension of each of the third coil conductors 211 and 221 is smaller than the internal dimension of each of the first and second coil conductors 21 and 22 by about one turn, since a large number of the first and second coil conductors 21 and 22 are provided, a decrease in the Q value is sufficiently small if the coil 2 is seen as a whole. In the case illustrated in FIG. 10, the thickness of the RFID tag substrate 100 is increased by the thickness of the insulating layer 1h used for providing the third coil conductor 221. However, the internal dimension of each of the third coil conductors 211 and 221 is not smaller than the internal dimension of each of the first and second coil conductors 21 and 22, and thus, it is more advantageous in terms of Q value.

In each of the third coil conductors 211 and 221, the gap between an inner conductor (line) and an outer conductor (line) is constant and can be the same as the gap between conductors (lines) in each of the first and second coil conductors 21 and 22. By forming a small gap that does not cause a short-circuit between conductors, the internal dimensions of the third coil conductors 211 and 221 will not become too small compared with the first coil conductors 21 and the second coil conductors 22, and the Q value of the coil 2 will not decrease.

Figure 11:
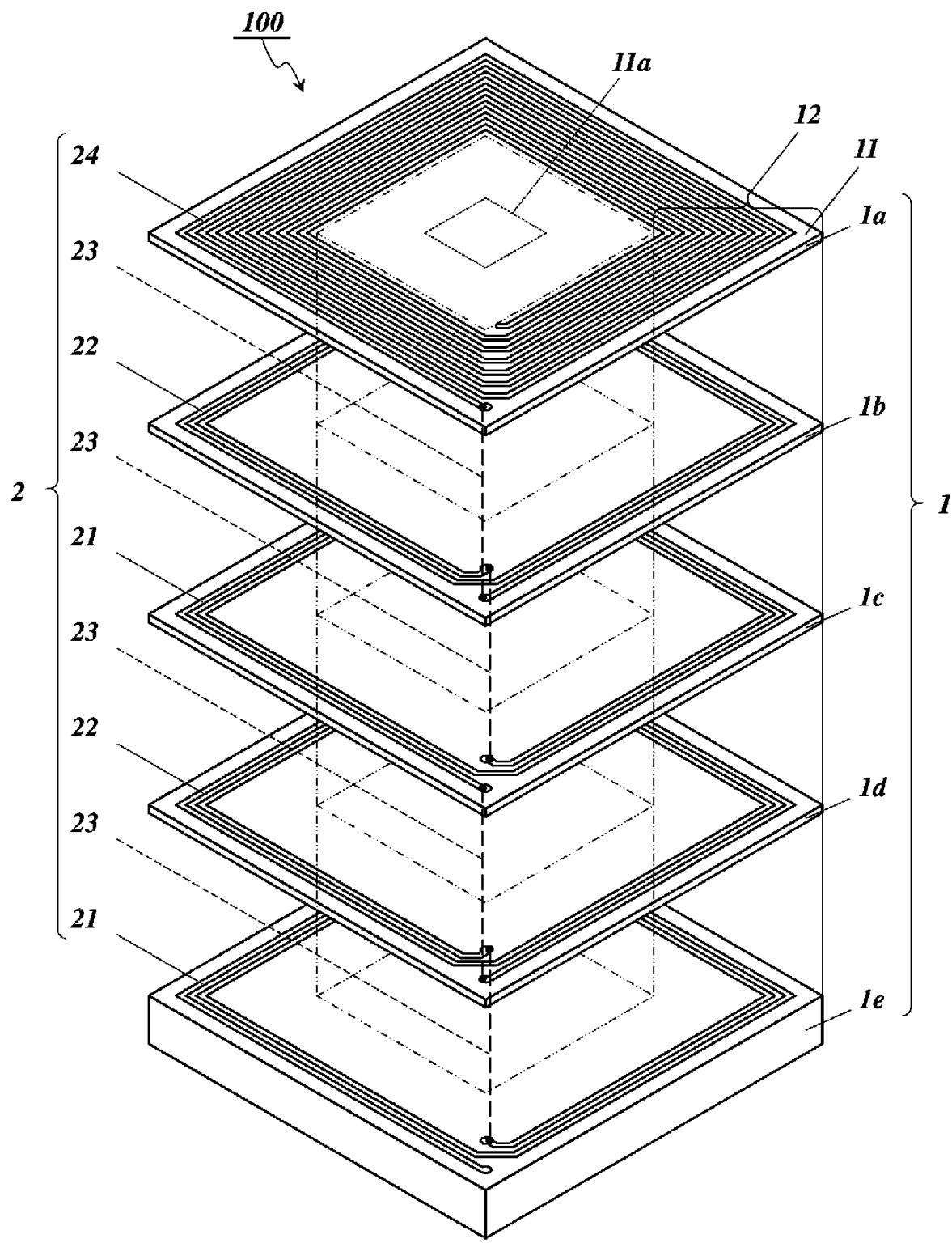
FIG. 11 is an exploded perspective view illustrating another example of the RFID tag substrate.
Figure 12A:
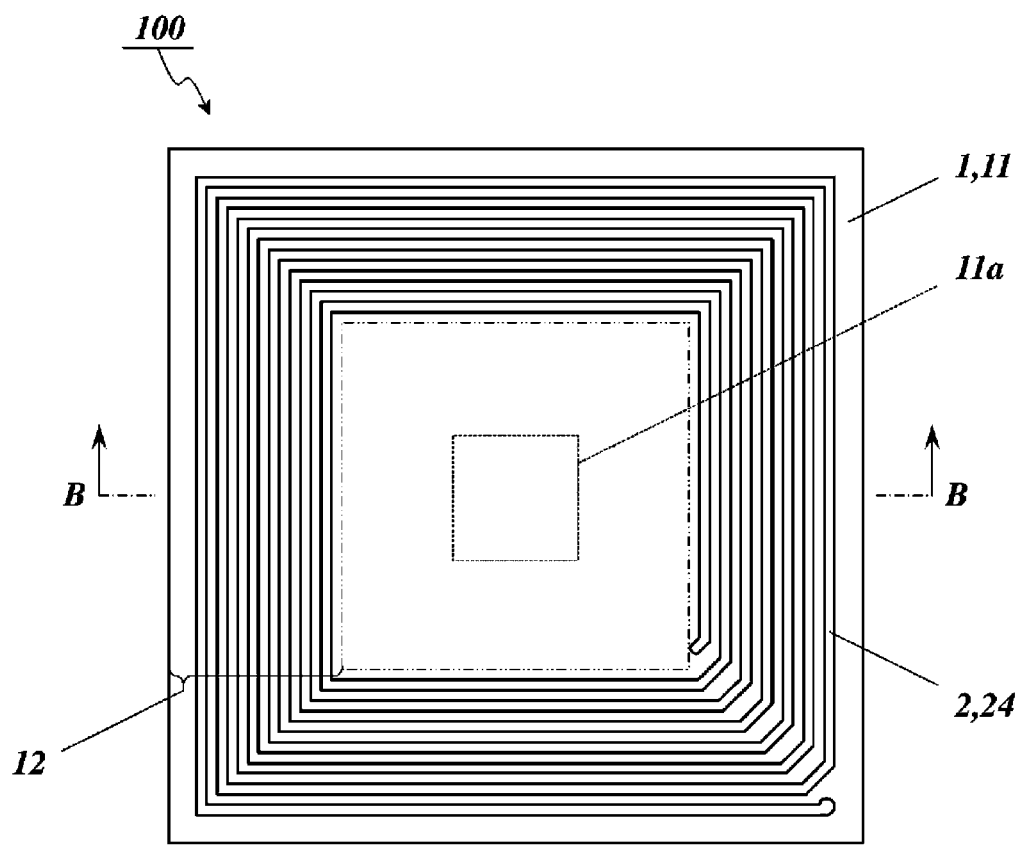
FIG. 12A is a plan view of the RFID tag substrate illustrated in FIG. 11.
Figure 12B:
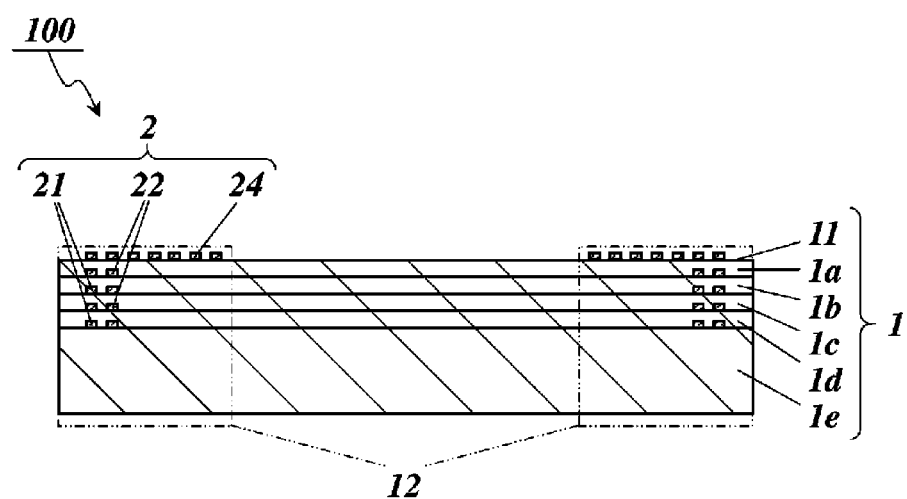
FIG. 12B is a sectional view taken along line B-B of FIG. 12A.
Figure 13:
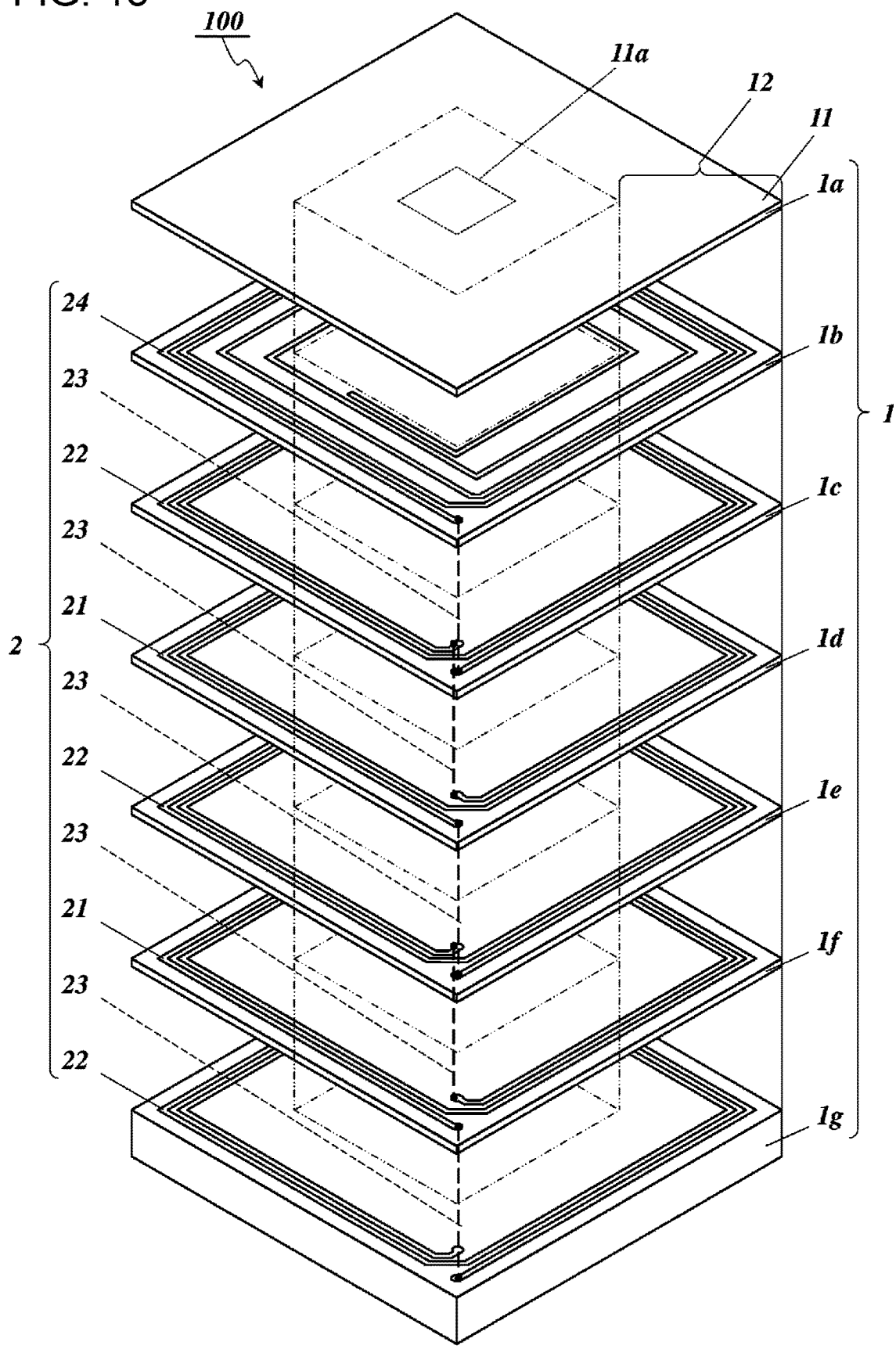
FIG. 13 is an exploded perspective view illustrating another example of the RFID tag substrate.

FIG. 11 is the exploded perspective view illustrating another example of the RFID tag substrate. FIG. 12A is the plan view of the RFID tag substrate illustrated in FIG. 11, and FIG. 12B is the sectional view taken along line B-B of FIG. 12A. FIG. 13 is the exploded perspective view illustrating another example of the RFID tag substrate. Note that, also in the exploded perspective views, coil-connecting conductors and through conductors of a wiring conductor are each indicated by a long dashed line having black circles at the two ends thereof that correspond to connecting portions.

In the RFID tag substrate 100 in the case illustrated in FIG. 11 to FIG. 12B, the coil 2 includes two first coil conductors 21, two second coil conductors 22, and a single fourth coil conductor 24. In the insulating substrate 1, the second coil conductors 22 and the first coil conductors 21 are sequentially and alternately arranged starting from the side on which the first surface 11 is present (the upper side), and the fourth coil conductor 24 is provided on the uppermost insulating layer 1a, that is, the first surface 11 of the insulating substrate 1. The fourth coil conductor 24 is connected to one of the second coil conductors 22 that is closest to the first surface 11 of the insulating substrate 1 by one of the coil-connecting conductors 23. The fourth coil conductor 24, the two first coil conductors 21, and the two second coil conductors 22 are connected in series to one another by the coil-connecting conductors 23, so that the coil 2 is formed. In addition, in the center portion of the first surface 11 of the insulating substrate 1, the mounting region 11a for the semiconductor device 200 is formed in such a manner as to be surrounded by the fourth coil conductor 24.

The fourth coil conductor 24 in this case has an external dimension that is the same as that of each of the first and second coil conductors 21 and 22 and has a shape obtained by extending one of the first coil conductors 21 inward such that the conductor length is increased and such that the number of turns is increased by five turns. In other words, the internal dimension of the fourth coil conductor 24 is smaller than that of each of the first and second coil conductors 21 and 22. The first coil conductors 21 and the second coil conductors 22 are each disposed in an outer region of the outer edge portion 12, that is, a region close to the side surfaces of the insulating substrate 1. In contrast, the fourth coil conductor 24 in this case extends from a position close to the side surfaces of the insulating substrate 1 to a position close to the inner edge of the outer edge portion 12 and is present over substantially the entire outer edge portion 12 of the first surface 11.

The winding direction of the fourth coil conductor 24 is the same as the winding direction of the first coil conductors 21 and opposite to the winding direction of the second coil conductor 22 to which the fourth coil conductor 24 is connected. If the coil 2 is seen as a whole, the coil conductors whose winding directions are opposite to each other are alternately arranged. Thus, each pair of the coil conductors (including the first coil conductors 21, the second coil conductors 22, and the fourth coil conductor 24) that are vertically adjacent to each other can be connected to each other only by one of the coil-connecting conductors 23, the coil-connecting conductor 23 extending through one of the insulating layers 1a to 1d that is positioned between the pair of coil conductors. Therefore, the RFID tag substrate 100 that is thin even if the coil 2 has a large number of turns can be obtained.

In the RFID tag substrate 100 in the case illustrated in FIG. 13, the coil 2 includes two first coil conductors 21, three second coil conductors 22, and a single fourth coil conductor 24. The fourth coil conductor 24 is provided between the uppermost insulating layer 1a and the insulating layer 1b, which is positioned below the insulating layer 1a. In other words, the coil 2 in this case includes the fourth coil conductor 24 that is disposed between the insulating layer 1a, which is closest to the first surface 11 of the insulating substrate 1, and the insulating layer 1b. In the insulating substrate 1, the second coil conductors 22 and the first coil conductors 21 are sequentially and alternately arranged starting from the side on which the first surface 11 is present (the upper side). Also in this case, the fourth coil conductor 24 is connected to one of the second coil conductors 22, the second coil conductor 22 being located further toward the upper side than the other second coil conductors 22, by one of the coil-connecting conductors 23. The fourth coil conductor 24, the two first coil conductors 21, and the three second coil conductors 22 are connected in series to one another by the coil-connecting conductors 23, so that the coil 2 is formed.

In addition, similar to the case illustrated in FIG. 11 to FIG. 12B, the fourth coil conductor 24 in this case has an external dimension that is the same as that of each of the first and second coil conductors 21 and 22 and has a shape obtained by extending one of the first coil conductors 21 inward such that the number of turns is increased. However, the length by which the first coil conductor 21 is extended inward is different from that in the case illustrated in FIG. 11 to FIG. 12B, and the fourth coil conductor 24 in this case has a shape obtained by extending one of the first coil conductors 21 inward such that the conductor length is increased and such that the number of turns is increased by about 2.2 turns. Although the conductor length of the fourth coil conductor 24 in this case and the length of the portion extended inward with respect to the first coil conductors 21 are shorter than those in the case illustrated in FIG. 11 to FIG. 12B, the number of the second coil conductors 22 is larger than that in the case illustrated in FIG. 11 to FIG. 12B, and thus, the conductor length of the coil 2 is the same in both cases. In this case, the gap between portions of the fourth coil conductor 24 on the inner side and the gap between portions of the fourth coil conductor 24 on the outer side are different from each other, and the gap between the two turns on the inner side is larger than the gap between the two turns on the outer side. Thus, the internal dimension of the fourth coil conductor 24 in this case is the same as the internal dimension of the fourth coil conductor 24 in the case illustrated in FIG. 11 to FIG. 12B and is smaller than the internal dimension of each of the first and second coil conductors 21 and 22. Also in this case, the mounting region 11a for the semiconductor device 200 is formed in the center portion of the first surface 11 of the insulating substrate 1, and in the perspective plan view, the mounting region 11a is located inside the fourth coil conductor 24.

As in the cases illustrated in FIG. 11 to FIG. 13, the RFID tag substrate 100 can be obtained in which the insulating substrate 1 has the mounting region 11a for the semiconductor device 200, the mounting region 11a being formed in the center portion of the first surface 11, and in which the coil 2 includes the fourth coil conductor 24 that is positioned at the end portion of the coil 2 (including the first surface 11), the end portion being closer to the first surface 11 of the insulating substrate 1, and that has an internal dimension smaller than that of each of the first and second coil conductors 21 and 22.

The fourth coil conductor 24 has an internal dimension smaller than that of each of the first and second coil conductors 21 and 22, which are positioned below the fourth coil conductor 24, and the fourth coil conductor 24 is positioned close to the first surface 11 of the insulating substrate 1. Thus, in the vicinity of the first surface 11 of the insulating substrate 1, a magnetic flux that is generated around the coil 2 is likely to concentrate at the center portion inside the fourth coil conductor 24. Since the mounting region 11a for the semiconductor device 200 is formed in the center portion of the first surface 11, the connectivity between the semiconductor device 200, which is disposed in the mounting region 11a, and the RFID tag substrate 100 is improved. Thus, the RFID tag substrate 100 may be obtained by which the RFID tag 300 having improved communication reliability can be obtained. As in the case illustrated in FIG. 11 to FIG. 12B, the RFID tag substrate 100 in this case does not include the connection pads 31 to be electrically connected to the semiconductor device 200 mounted thereon. As described above, it is effective in the case where the coil 2 of the RFID tag substrate 100 and the semiconductor device 200 are not electrically connected to each other and are connected to each other only by an electromagnetic field.

The fourth coil conductor 24 is the same as each of the third coil conductors 211 and 221 in that it has a conductor length different from that of each of the first and second coil conductors 21 and 22. As mentioned above, the third coil conductors 211 and 221 are provided for making fine adjustments to the entire length of the coil 2 (the length of the conductor) and the internal dimensions of the third coil conductors 211 and 221 are set so as not to be small as much as possible. Thus, the number of turns (the conductor length) of each of the third coil conductors 211 and 221 is not very large (not very long) compared with each of the first and second coil conductors 21 and 22. More specifically, the conductor length of each of the third coil conductors 211 and 221 is less than twice the conductor length of each of the first and second coil conductors 21 and 22. In contrast, the fourth coil conductor 24 is formed so as to have a small internal dimension in order to concentrate a magnetic flux at the center portion, and thus, the conductor length of the fourth coil conductor 24 in the case illustrated in FIG. 11 to FIG. 12B is twice or more the conductor length of each of the first and second coil conductors 21 and 22.

Similar to each of the third coil conductors 211 and 221, the conductor length of the fourth coil conductor 24 in the case illustrated in FIG. 13 is longer than the conductor length of each of the first and second coil conductors 21 and 22 and is less than twice the conductor length of each of the first and second coil conductors 21 and 22. However, the fourth coil conductor 24 is different from each of the third coil conductors 211 and 221 in that the internal dimension of the fourth coil conductor 24 is reduced to be smaller than that of each of the first and second coil conductors 21 and 22 by increasing the gap between portions of the fourth coil conductor 24. Since the conductor length of the fourth coil conductor 24 in the case illustrated in FIG. 11 to FIG. 12B is twice or more the conductor length of each of the first and second coil conductors 21 and 22, the conductor density on the insulating layer 1a on which the fourth coil conductor 24 is disposed is higher than that on each of the other insulating layers (between insulating layers). In contrast, since the conductor length of the fourth coil conductor 24 in the case illustrated in FIG. 13 is less than twice the conductor length of each of the first and second coil conductors 21 and 22, the difference between the density of the fourth coil conductor 24 and the density of each of the other coil conductors is small. Thus, the possibility of warpage of the RFID tag substrate 100 is reduced. When the RFID tag substrate 100 is manufactured, in a firing process, warpage caused by the difference in firing shrinkage between a conductor and a ceramic body is small, and the flatness of the surface of the RFID tag substrate 100, that is, the first surface 11 of the insulating substrate 1 is high. Therefore, the mountability of the semiconductor device 200 and the ability of the RFID tag 300 to be attached to an item become favorable.

The conductor length of the fourth coil conductor 24 may be shorter than that of each of the first and second coil conductors 21 and 22, and the number of turns of the fourth coil conductor 24 may be smaller than that of each of the first and second coil conductors 21 and 22 as long as the fourth coil conductor 24 has a small internal dimension. For example, the fourth coil conductor 24 in the case illustrated in FIG. 13 can be divided into two portions, which are another first coil conductor 21 and the fourth coil conductor 24 that has a conductor length shorter than that of the first coil conductor 21 and an internal dimension smaller than that of the first coil conductor 21.

In the RFID tag substrate 100 in the case illustrated in FIG. 11 to FIG. 12B, the insulating layer 1e, which is the lowermost layer, has a thickness larger than that of each of the other insulating layers 1a to 1d. Also in the RFID tag substrate 100 in the case illustrated in FIG. 13, the insulating layer 1g, which is the lowermost layer, has a thickness larger than that of each of the other insulating layers 1a to 1f. In this manner, the insulating layers included in the insulating substrate 1 do not need to have the same thickness. In addition, instead of a single insulating layer having a large thickness, a plurality of insulating layers with no conductors interposed therebetween may be provided. By providing such insulating layers in addition to an insulating layer for providing the coil 2 having a required inductor length, the strength of the insulating substrate 1 can be improved. In addition, if the RFID tag substrate 100 is mounted onto an item by, for example, attaching the bottom surface of the RFID tag substrate 100 to onto the item, because the thickness of the insulating layer between the item and the coil 2 is large, a magnetic flux easily passes through the insulating layer even if a surface of the item is an electric conductor made of a metal or the like, so that the communication characteristics are improved.

Figure 14:
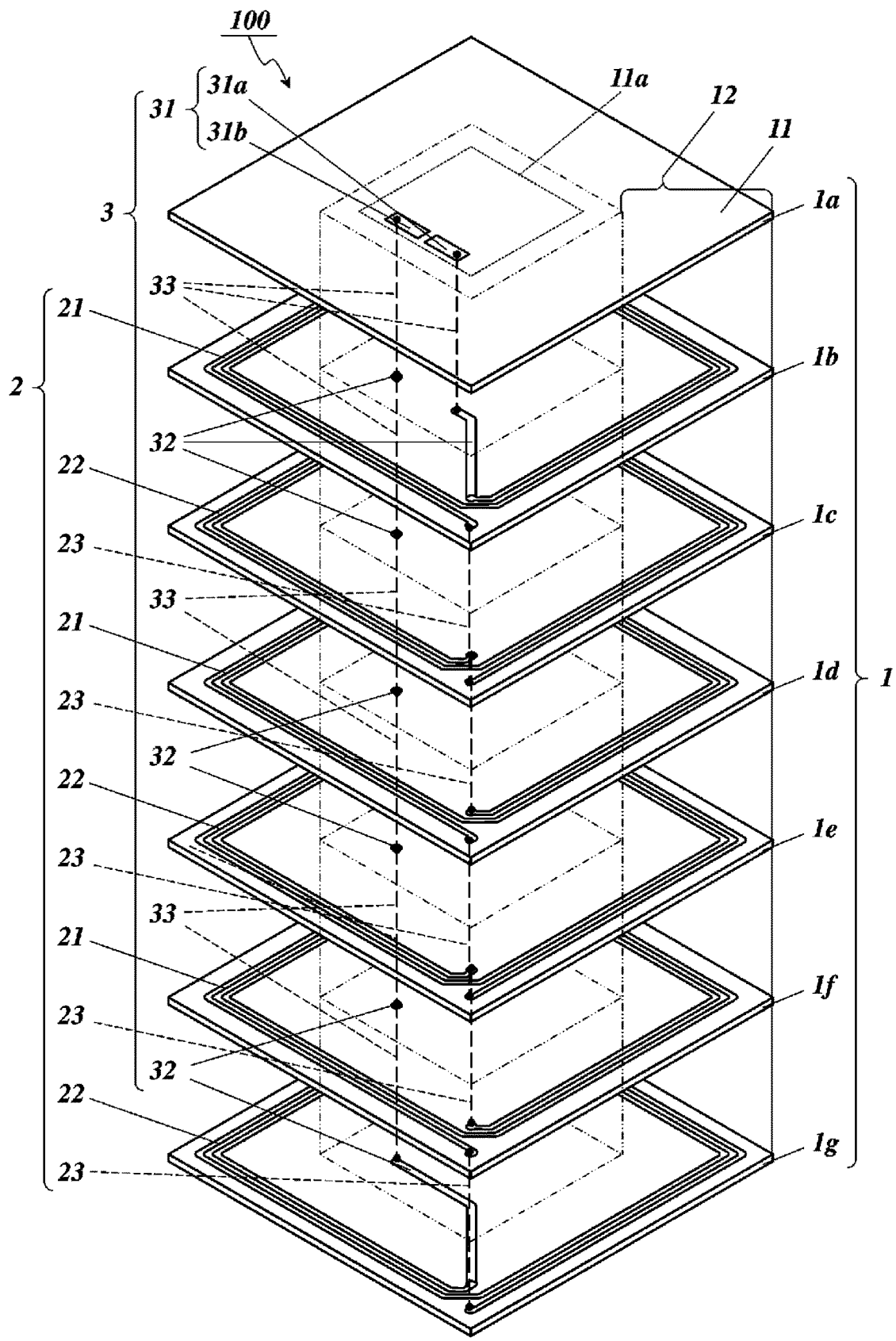
FIG. 14 is an exploded perspective view illustrating another example of the RFID tag substrate.
Figure 15A:
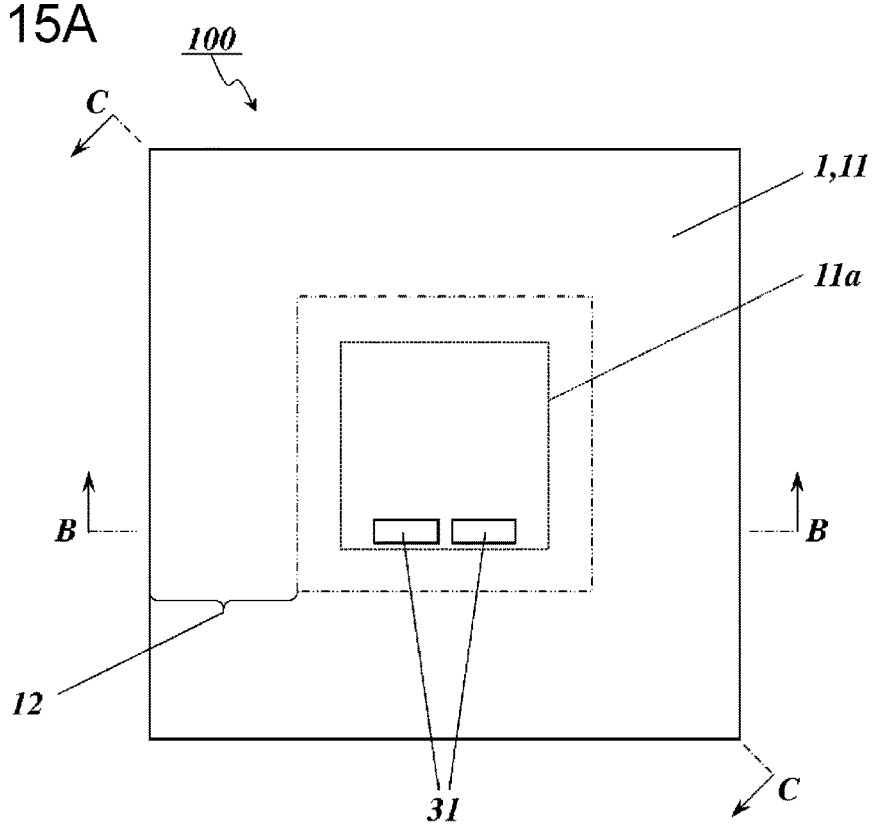
FIG. 15A is a plan view of the RFID tag substrate illustrated in FIG. 14.
Figure 15B:
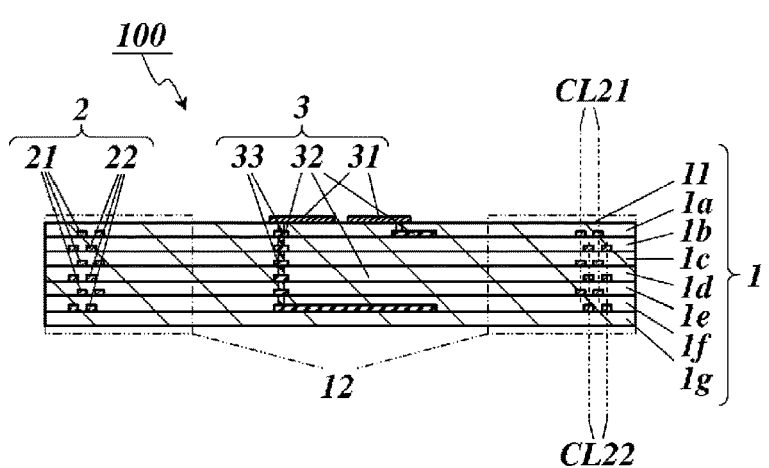
FIG. 15B is a sectional view taken along line B-B of FIG. 15A.
Figure 15C:
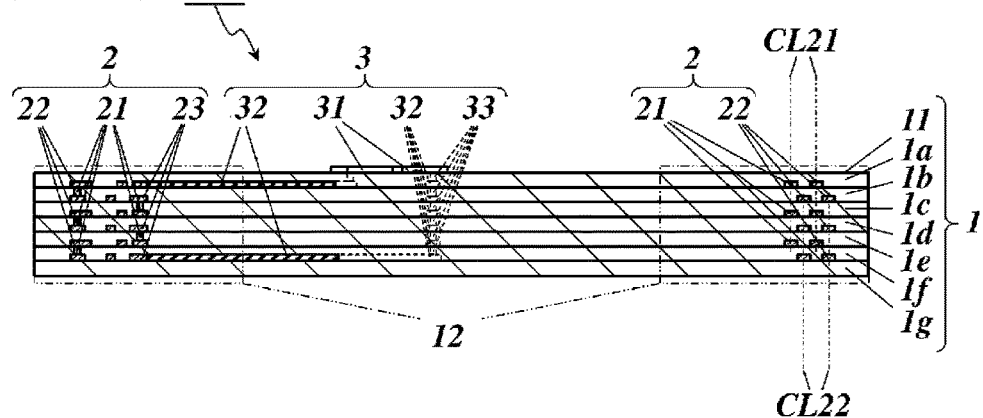
FIG. 15C is a sectional view taken along line C-C of FIG. 15A.
Figure 16:
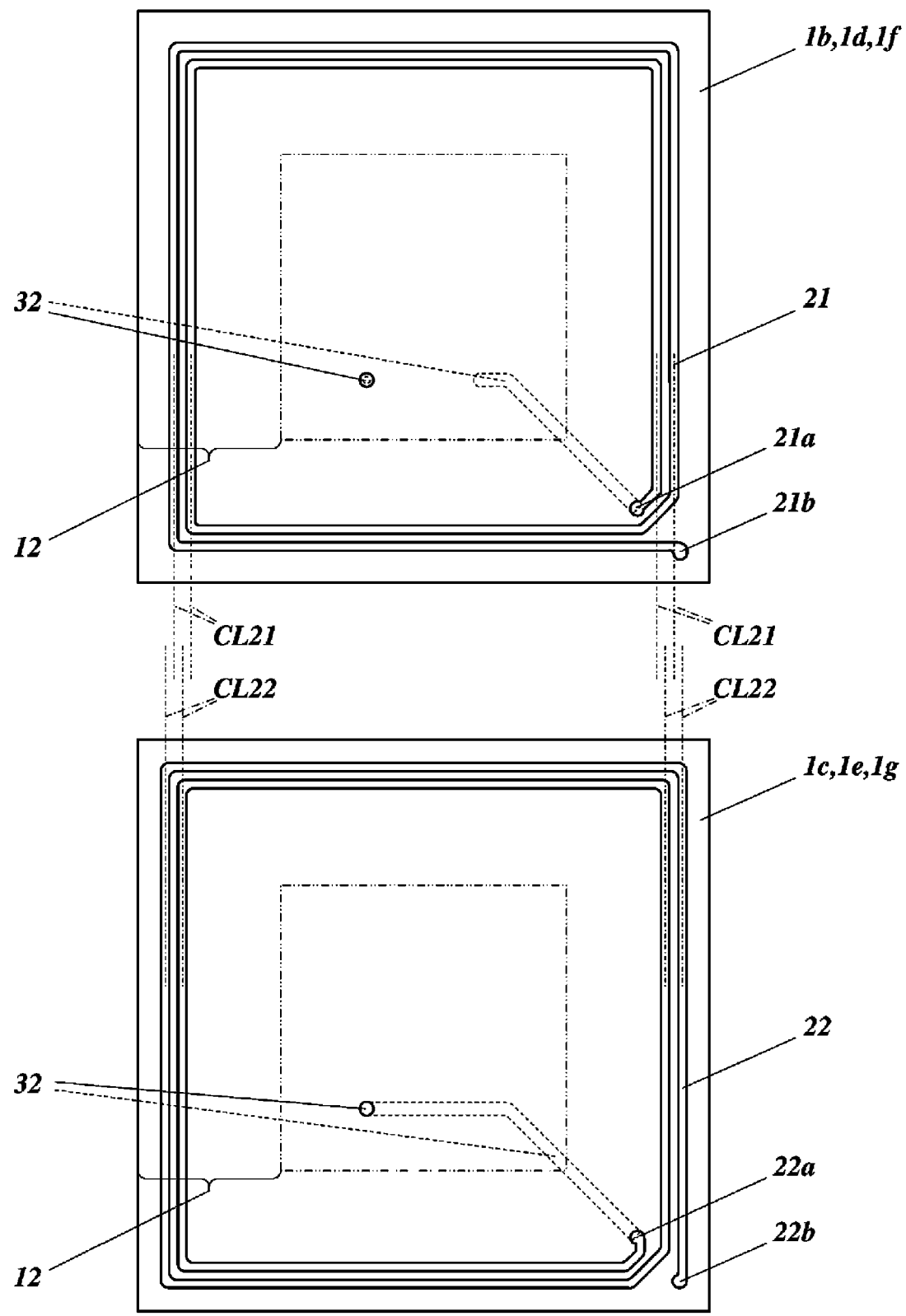
FIG. 16 is a plan view illustrating a portion of the RFID tag substrate illustrated in FIG. 14.

FIG. 14 is the exploded perspective view illustrating another example of the RFID tag substrate. FIG. 15A is the plan view of the RFID tag substrate illustrated in FIG. 14. FIG. 15B is the sectional view taken along line B-B of FIG. 15A. FIG. 15C is the sectional view taken along line C-C of FIG. 15A. FIG. 16 is the plan view illustrating a portion of the RFID tag substrate illustrated in FIG. 14. More specifically, FIG. 16 is the exploded plan view in which the first coil conductor 21 provided on each of the insulating layers 1b, 1d, and if and the second coil conductor 22 provided on each of the insulating layers 1c, 1e, and 1g are illustrated by being arranged vertically. Note that, also in the exploded perspective view illustrated in FIG. 14, coil-connecting conductors and through conductors of a wiring conductor are each indicated by a long dashed line having black circles at the two ends thereof that correspond to connecting portions.

In each of the RFID tag substrates 100 in the case illustrated in FIG. 1 to FIG. 13, although the winding direction of the first coil conductors 21 and the winding direction of the second coil conductors 22 are opposite to each other, the first and second coil conductors 21 and 22 have the same external dimension and the same internal dimension, and thus, substantially the entire first coil conductors 21 and substantially the entire second coil conductors 22 are superposed with each other in the perspective plan view. In contrast, in the RFID tag substrate 100 in the case illustrated in FIG. 14, FIG. 15A to FIG. 15C, and FIG. 16, the first coil conductors 21 and the second coil conductors 22 hardly overlap each other in the perspective plan view. Each of the first coil conductors 21 has an internal dimension and an external dimension that are smaller than those of each of the second coil conductors 22, and the first coil conductors 21 and the second coil conductors 22 are displaced from each other. Each of the first coil conductors 21 has two turns, and outer conductors of the first coil conductors 21 are positioned between two conductors of each of the second coil conductors 22 in the perspective plan view, and inner conductors of the first coil conductors 21 are positioned inside the second coil conductors 22 in the perspective plan view.

The RFID tag substrate 100 can be obtained in which the first coil conductors 21 and the second coil conductors 22 are displaced from each other in the perspective plan view. Since the first coil conductors 21 and the second coil conductors 22 are displaced from each other in the perspective plan view, the first coil conductors 21 and the second coil conductors 22 do not overlap each other or their overlapping portions are small in the perspective plan view. Thus, a capacitance component that is generated between the first coil conductors 21 and the second coil conductors 22 becomes small, and the Q value of the coil 2 increases, so that the RFID tag substrate 100 having a long communication range may be obtained. In addition, if the first coil conductors 21 and the second coil conductors 22 overlap each other (if their overlapping portions are large), the difference in stacking thickness between portions that include the first coil conductors 21 and the second coil conductors 22 and portions that do not include the first coil conductors 21 and the second coil conductors 22 becomes large, and there is a possibility that separation of the insulating layers will occur. As a result of the first coil conductors 21 and the second coil conductors 22 being displaced from each other in the perspective plan view, the possibility of such separation will occur is reduced.

If the first coil conductors 21 and the second coil conductors 22 are displaced from each other in the perspective plan view, the first coil conductors 21 and the second coil conductors 22 may overlap each other. In the RFID tag substrate 100 in the case illustrated in FIG. 14, FIG. 15A to FIG. 15C, and FIG. 16, the end portions 21a and 21b of the first coil conductors 21 and the end portions 22a and 22b of the second coil conductors 22 are positioned so as to overlap each other in the perspective plan view and connected to each other by the coil-connecting conductors 23. In addition, since the winding direction of the first coil conductors 21 and the winding direction of the second coil conductors 22 are opposite to each other, some portions of the first and second coil conductors 21 and 22 cross and overlap each other in the perspective plan view. Excluding such portions, a conductor line of each of the second coil conductors 22 is positioned between conductor lines of the first coil conductors 21 as mentioned above. It can also be said that the center of each of the first coil conductors 21 in a conductor line width direction (a center line CL21) and the center of each of the second coil conductors 22 in a conductor line width direction (a center line CL22) are out of alignment. In FIG. 15B, FIG. 15C, and FIG. 16, the center line CL21 of the first coil conductors 21 and the center line CL22 of the second coil conductors 22 are out of alignment and do not overlap each other. In the case where the conductor line width of each of the first and second coil conductors 21 and 22 is larger than the gap between conductor lines, portions of the conductor lines (the two end portions of the conductor lines in the width direction of the conductor lines) overlap each other.

In the case where the coil 2 includes the third coil conductors 211 and 221 or the fourth coil conductor 24, these also can be set so as not to overlap the adjacent first coil conductor 21 or the adjacent second coil conductor 22.

By mounting the semiconductor device 200 onto the mounting region 11a of the RFID tag substrate 100 such as that described above, the RFID tag 300 can be obtained. In other words, the RFID tag 300 includes the RFID tag substrate 100 such as that described above and the semiconductor device 200 mounted on the RFID tag substrate 100. Since the RFID tag 300 includes the RFID tag substrate 100 such as that described above that is small and that has favorable communication characteristics, the RFID tag 300 may be also small and may also have favorable communication characteristics.

Figure 17:
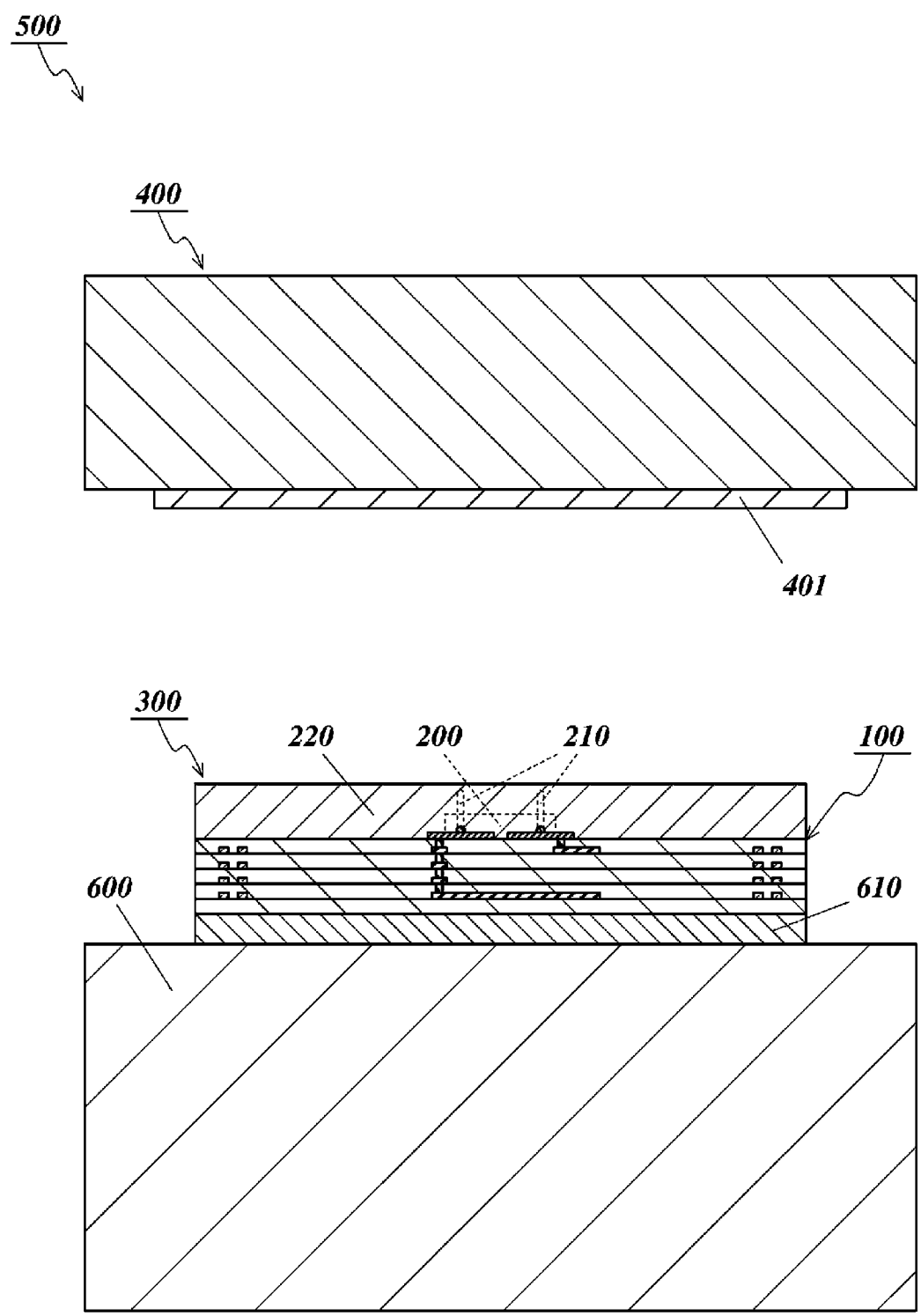
FIG. 17 is a schematic diagram illustrating an example of an RFID system.

FIG. 17 is a schematic diagram illustrating an example of an RFID system. The RFID system 500 illustrated in FIG. 17 is an example of an RFID system that includes the RFID tag 300 illustrated in FIG. 1 to FIG. 5. For example, as illustrated in FIG. 17, the RFID system 500 includes the RFID tag 300 having the above-described configuration and the reader-writer 400 that includes an antenna 401 that transmits and receives radio waves to and from the RFID tag 300. In the RFID system 500 illustrated in FIG. 17, the RFID tag 300 is used by being attached to an item 600 with an adhesive member 610 in such a manner that a surface (the bottom surface) of the RFID tag 300 that is opposite to the first surface 11 (the top surface), on which the semiconductor device 200 is mounted, faces the item 600. Since the RFID system 500 includes the RFID tag 300 such as that described above that has favorable communication characteristics, even if the RFID tag 300 that is small in size is used, the RFID system 500 having favorable communication characteristics such as a long communication range may be obtained. The RFID tag 300 of the RFID system 500 is not limited to the RFID tag 300 illustrated in FIG. 1 to FIG. 5, and the RFID system 500 may include the RFID tag 300 that uses at least one of the RFID tag substrates 100 illustrated in FIG. 6 to FIG. 16.

In each of the RFID tags 300 that use the RFID tag substrates 100 in the case illustrated in FIG. 1 to FIG. 10 and the RFID tag substrate 100 in the case illustrated in FIG. 14, FIG. 15A to FIG. 15C, and FIG. 16, as in the case illustrated in FIG. 1 and FIG. 2A to FIG. 2C, the coil 2 is electrically connected to the semiconductor device 200 by the wiring conductor 3 (the connection pads 31, the wiring layers 32, and the through conductors 33) in order to supply the current (electrical power) generated in the coil 2 to the semiconductor device 200 so as to cause the semiconductor device 200 to operate (write and read item information). As a result, various information items are transmitted and received between the RFID tag 300 and the reader-writer 400.

In addition, in each of the RFID tags 300 that use the RFID tag substrate 100 in the case illustrated in FIG. 11, FIG. 12A, and FIG. 12B and the RFID tag substrate 100 in the case illustrated in FIG. 13, for example, the semiconductor device 200 that includes a coil for an antenna built therein is used. In this case, the semiconductor device 200 and the coil 2 of the RFID tag substrate 100 do not need to be directly and electrically connected to each other, and power is supplied in a non-contact manner between the coil of the semiconductor device 200 and the coil 2 of the RFID tag substrate 100. In this case, in order to further improve the communication between the coil for an antenna, which is included in the semiconductor device 200, and the coil 2 of the RFID tag substrate 100, it is preferable that the coil of the semiconductor device 200 and the coil 2 of the RFID tag substrate 100 be positioned as close as possible to each other. Thus, in the RFID tag substrate 100 in the case illustrated in FIG. 11, FIG. 12A, and FIG. 12B, the fourth coil conductor 24 positioned at the upper end of the coil 2 is disposed on the first surface 11 of the insulating substrate 1 in which the mounting region 11a for the semiconductor device 200 is also formed. In addition, in the RFID tag substrate 100 in the case illustrated in FIG. 13, the fourth coil conductor 24 positioned at the upper end of the coil 2 is disposed between the insulating layers 1a and 1b that are located immediately below the first surface 11 in which the mounting region 11a for the semiconductor device 200 is formed.

As in the RFID tag 300 in the case illustrated in FIG. 17, the semiconductor device 200 can be covered with a sealing member 220. For example, the sealing member 220 contains, as a main component, an insulating resin and can protect the semiconductor device 200 and the wiring conductor 3 (the connection pads 31) on the first surface 11 or the fourth coil conductor 24 or the like by covering the semiconductor device 200 and the first surface 11. In the RFID tag substrate 100 in the case illustrated in FIG. 8, the semiconductor device 200 and the wiring conductor 3 (the connection pads 31) can be protected by, for example, filling the through hole 1ta the frame-shaped insulating layer 1t, that is, the recess, with the sealing member 220.

The insulating substrate 1 is a basic structural portion of the RFID tag substrate 100 and has functions of ensuring the mechanical strength of the RFID tag substrate 100, ensuring the electrical insulation between the plurality of conductors (the coil 2 and the wiring conductor 3), and so forth. For example, if viewed from above (in the plan view), the insulating substrate 1 has a quadrangular shape such as a square shape as mentioned above. Regarding the dimensions of the insulating substrate 1, for example, the length of one side of the quadrangle is 2 mm to 20 mm, and the thickness of the quadrangle is 0.3 mm to 3 mm.

The insulating substrate 1 has the mounting region 11a that is formed in the first surface 11 and in which the semiconductor device 200 is disposed. In the drawings, the mounting region 11a is a portion that is virtually illustrated by being surrounded by a dotted line. Although the mounting region 11a is literally a region in which the semiconductor device 200 is disposed, in the case where the connection pads 31 that are electrically connected to the semiconductor device 200 are provided, the mounting region 11a is a region including a region in which the semiconductor device 200 is fixed in place and a region in which the connection pads 31 are positioned.

The insulating substrate 1 is made of, for example, a ceramic material such as an aluminum oxide sintered compact, a glass ceramic sintered compact, a mullite sintered compact, or an aluminum nitride sintered compact or is made of, for example, an insulating material such as an organic material that contains an epoxy resin as a main component. The insulating substrate 1 includes a plurality of insulating layers 1a to 1i and the frame-shaped insulating layer 1t stacked on top of one another. The number of the insulating layers is five in the case illustrated in FIG. 1 to FIG. 5 and in the case illustrated in FIG. 11 to FIG. 12B, six in the case illustrated in FIG. 6, seven in the case illustrated in FIG. 13 to FIG. 15C, eight in the case illustrated in FIG. 7 and FIG. 8, and nine in the case illustrated in FIG. 10. However, the number of the insulating layers is not limited to these. The number of the insulating layers can be set such that the coil 2 that corresponds to the characteristics required for the RFID tag substrate 100 can be built in. In the case where the insulating substrate 1 (each of the insulating layers) is made of a ceramic material, the RFID tag 300 that has a high strength, a high heat resistance, and a high reliability can be obtained. In the case where the insulating substrate 1 (each of the insulating layers) is made of a glass ceramic sintered compact that is one of ceramic materials and that contains a glass component and ceramic particles, copper or silver having a low resistance can be used for the coil 2 and the wiring conductor 3, and the RFID tag 300 that has a longer communication range with a small loss can be obtained. Also in the case where the insulating substrate 1 (each of the insulating layers) is made of an organic material, copper having a low resistance can be used for the coil 2 and the wiring conductor 3.

In the case where the insulating substrate 1 is made of, for example, a glass ceramic sintered compact, the insulating substrate 1 can be manufactured in the following manner. First, a raw material powder that contains, as main components, a silicon oxide or boron oxide powder that serves as a glass component and an aluminum oxide powder or the like that serves as a filler component, is kneaded with an organic solvent and a binder so as to form a slurry. This slurry is formed into sheets by a molding method such as a doctor blade method or a lip coater method so as to manufacture ceramic green sheets (hereinafter also referred to as green sheets) that will become the insulating layers of the insulating substrate 1. A through hole is formed in the green sheet that will become the frame-shaped insulating layer 1t, which has the through hole 1ta, by punching the green sheet by using a die or the like. Next, the plurality of green sheets are stacked on top of one another so as to form a multilayer body. After that, the multilayer body is fired at a temperature of about 900° C. to 1,000° C., so that the insulating substrate 1 can be manufactured. In the case where the insulating substrate 1 is made of an organic material, the insulating substrate 1 can be manufactured by stacking epoxy resin sheets on top of one another and bonding the epoxy resin sheets together.

The RFID tag substrate 100 including the insulating substrate 1 can also be manufactured as a multi-piece substrate in which a plurality of substrate regions each of which will be the RFID tag substrate 100 such as that described above are arranged on a mother substrate. A plurality of RFID tag substrates 100 can also be more efficiently manufactured by dividing the mother substrate including the plurality of substrate regions into each substrate region. In this case, the mother substrate may have grooves for dividing that extend along the boundaries between the substrate regions.

The insulating substrate 1 includes conductors such as the coil 2 and the wiring conductor 3. As described above, the coil 2 includes the first coil conductors 21, the second coil conductors 22, and the coil-connecting conductors 23 extending through the insulating layers so as to connect the first coil conductors 21 and the second coil conductors 22, and in addition, the coil 2 can include the third coil conductors 211 and 221 or the fourth coil conductor 24. The wiring conductor 3 includes the connection pads 31 provided in the mounting region 11a, the wiring layers 32 provided on the surface of the insulating substrate 1 or inside the insulating substrate 1 (between the insulating layers), and the through conductors 33 extending through the insulating layers so as to connect the connection pads 31 and the wiring layers 32 to each other and so as to connect the wiring layers 32.

For example, the coil 2 and the wiring conductor 3 each mainly contains, as a conductor material, a metal material that is a metal such as tungsten, molybdenum, manganese, copper, silver, palladium, gold, platinum, nickel or cobalt or an alloy containing at least two of these metals. Such a metal material is included, as a metal thin film or a metal foil, in the insulating substrate 1 by metallizing, plating, evaporation, or the like. In the case where the insulating substrate 1 is made of, for example, a ceramic material, the metal material is provided on the insulating substrate 1 by metallizing.

Conductor layers such as the first coil conductors 21, the second coil conductors 22, the third coil conductors 211 and 221, and the fourth coil conductor 24 of the coil 2 and the connection pads 31 and the wiring layers 32 of the wiring conductor 3 can be formed in the following manner. In the case where the conductor layers are, for example, copper metallized layers, the conductor layers can be formed by a method in which a metal paste that is formed by mixing copper powder with an organic solvent and an organic binder is printed at predetermined locations on the ceramic green sheets, which will form the insulating substrate 1, by a method such as screen printing and then fired together with the ceramic green sheets. In addition, plating layers made of, for example, nickel and gold may be deposited onto exposed surfaces of the metallized layers such as the connection pads 31 and portions of the coil 2 on the surface of the insulating substrate 1 by a plating method such as an electrolytic plating method or an electroless plating method. The coil-connecting conductors 23 of the coil 2 and the through conductors 33 of the wiring conductor 3 can be formed by forming through holes at predetermined locations on the ceramic green sheets and filling the through holes with a metal paste similar to that mentioned above before the above-mentioned printing of the metal paste. In the case where the insulating substrate 1 is made of an organic material, the conductor layers can be formed by transferring a metal foil formed in a predetermined shape by etching or the like onto a resin sheet. In addition, the through conductors can be formed by applying or injecting a conductive resin paste to or into through holes formed beforehand in the resin sheet or by filling the through holes with a metal by plating.

As described above, in order to increase the internal dimension of the coil 2 as much as possible, the coil 2 has a shape wound along the outer edge (the side surfaces). Since the shape of the insulating substrate 1 in the plan view is a quadrangular shape, the outer edge shape of each of the coil conductors (the first coil conductors 21, the second coil conductors 22, the third coil conductors 211 and 221, and the fourth coil conductor 24) in the plan view is also a quadrangular shape. Also in this case, the term "quadrangular shape" includes not only an exact quadrangular shape, but also a shape that is formed by, for example, rounding a corner of a quadrangular shape. In this case, especially the coil conductors that are located inside the insulating substrate 1 can each have a shape having a rounded corner as in the case illustrated in FIG. 14 and FIG. 16. If these coil conductors each have such a shape, even if a thermal stress is generated due to a difference in thermal expansion between the material of the coil conductors and the material of the insulating substrate 1, the corner portions at which the stress is likely to concentrated are rounded, and thus, the stress is dispersed, so that the possibility that the insulating substrate 1 will break by the stress is reduced. Note that, in the case illustrated in FIG. 14 and FIG. 16, a bent portion of the wiring layer 32 connected to the inner end portions 21a of the first coil conductors 21 and a bent portion of the wiring layer 32 connected to the inner end portions 22a of the second coil conductors 22 are also rounded.

In order to obtain a required inductor length, the coil 2 includes the plurality of the first coil conductors 21 and the plurality of the second coil conductors 22 and includes the third coil conductors 211 and 221 and the fourth coil conductor 24 as necessary, and these coil conductors are arranged in the thickness direction of the insulating substrate 1 and connected in series to one another. The size (the diameter and the number of turns) of each of the coil conductors (the first coil conductors 21 to the fourth coil conductor 24) and the number of the coil conductors arranged in the thickness direction of the insulating substrate 1 can be set in accordance with the communication frequency of the RFID tag 300 and the size of the RFID tag substrate 100 (the insulating substrate 1). For example, in order to increase the internal dimension and the Q value of, the number of turns of each of the first and second coil conductors 21 and 22 can be set to three or smaller, and the number of the first coil conductors 21 and the number of the second coil conductors 22 can each be set to about two to ten. In addition, the width of each of the coil conductors is about 50 μm to about 200 μm, and for example, the outer edges of the coil conductors are arranged at positions spaced apart inwardly from the side surfaces of the insulating substrate 1 by about 50 μm to about 1 mm.

As mentioned above, the semiconductor device 200 may include a coil built therein or may not include a coil built therein. In the case where the semiconductor device 200 does not include a coil built therein, (the terminal electrodes 201 of) the semiconductor device 200 is directly connected to the wiring conductor 3 (the connection pads 31) located in the mounting region 11a of the RFID tag substrate 100.

In the case illustrated in FIG. 1 to FIG. 3 and the case illustrated in FIG. 17, the connecting members 210 electrically connecting the terminal electrodes 201 of the semiconductor device 200 and the wiring conductor 3 (the connection pads 31) to each other are bonding wires. The semiconductor device 200 is bonded and fixed to (the mounting region 11a of) the first surface 11 of the insulating substrate 1 with a bonding material such as a resin adhesive (not illustrated). The semiconductor device 200 can also connected to the RFID tag substrate 100 by a so-called flip-chip bonding, in this case, the connecting members 210 are, for example, solder portions or conductive adhesive portions. In this case, fixation of the semiconductor device 200 to the first surface 11 is also performed by the connecting members 210, for example, the fixation can also be reinforced with a resin adhesive such as an epoxy resin.

As in the case illustrated in FIG. 17, in the case where the semiconductor device 200 is covered with the sealing member 220, for example, the sealing member 220 can contain, as a main component, a resin such as an epoxy resin or a phenol resin. For example, an epoxy resin containing a filler, such as ceramic particles, that is a common sealing resin can be used. The sealing member 220 can be formed by, for example, applying a liquid resin onto the first surface 11 of the insulating substrate 1 and the semiconductor device 200 by using a printing machine, a dispenser, or the like and curing the liquid resin. The liquid resin is, for example, a thermosetting resin.

In the case where the RFID tag substrate 100 is manufactured with a multi-piece substrate such as that mentioned above, the semiconductor device 200 may be disposed in each substrate region of the multi-piece substrate and covered with the sealing member 220, and then the multi-piece substrate may be cut and divided into a plurality of RFID tag 300 by dicing or the like.

Such RFID tags 300 are used by being attached to various items 600 in the RFID system 500. Various information items regarding the item 600 are written in the semiconductor device 200 of the RFID tag 300, and these information items can be rewritten whenever necessary in accordance with information transmitted and received between the antenna 401 of the reader-writer 400 and the RFID tag 300. As a result, various information items related to the item 600 are updated whenever necessary.

The RFID tag 300 is attached to the item 600 with, for example, the adhesive member 610 as in the case illustrated in FIG. 17. As the adhesive member 610, for example, an adhesive member such as a double-sided adhesive tape, a resin adhesive, or the like.

In the case where the RFID tag 300 is used by being attached to the item 600 that is made of a metal or the like and that has electrical conductivity, the adhesive member 610 can contain a magnetic material. The magnetic material includes, for example, a resin such as an epoxy resin or a phenol resin and magnetic particles. Electromagnetic waves from the reader-writer 400 can be guided to the coil 2 in the RFID tag substrate 100 before the electromagnetic waves reach the item 600 to which the RFID tag substrate 100 has been attached, and more magnetic flux can pass between the RFID tag substrate 100 and the item 600. If also the sealing member 220 contains a magnetic material, a magnetic flux easily passes through the sealing member 220, and the magnetic flux easily concentrates around the coil 2.

REFERENCE SIGNS LIST 1 insulating substrate
11 first surface
11a mounting region
12 outer edge portion
1a to 1i insulating layer
1t frame-shaped insulating layer
1ta through hole
2 coil
21 first coil conductor
21a inner end portion (of first coil conductor)
21b outer end portion (of first coil conductor)
22 second coil conductor
22a inner end portion (of second coil conductor)
22b outer end portion (of second coil conductor)
211, 221 third coil conductor
211a, 221a inner end portion (of third coil conductor)
211b, 221b outer end portion (of third coil conductor)
23 coil-connecting conductor
24 fourth coil conductor
3 wiring conductor
31, 31a, 31b connection pad
32 wiring layer
33 through conductor
100 RFID tag substrate 200 semiconductor device
201 terminal electrode
210 connecting member
220 sealing member
300 RFID tag
400 reader-writer
401 antenna
500 RFID system
600 item
610 adhesive member

The invention claimed is:

1. An RFID tag substrate comprising:
an insulating substrate that has a mounting region in which a semiconductor device is disposed, the mounting region being included in a first surface of the insulating substrate; and
a coil that is positioned at an outer edge portion of the insulating substrate,
wherein the coil includes a plurality of first coil conductors and a plurality of second coil conductors each having a same line width that are wound such that the first coil conductors and the second coil conductors each have the same number of turns and such that a direction in which the first coil conductors are wound and a direction in which the second coil conductors are wound are opposite to each other, and
wherein the first coil conductors and the second coil conductors are alternately arranged in a thickness direction of the insulating substrate and connected in series to one another.

2. The RFID tag substrate according to claim 1,
wherein at least one of two end portions of the coil in the thickness direction of the insulating substrate includes a third coil conductor that has a conductor length different from a conductor length of each of the first and second coil conductors.

3. The RFID tag substrate according to claim 2,
wherein the first coil conductors and the second coil conductors are displaced from each other in a perspective plan view.

4. An RFID tag comprising:
the RFID tag substrate according to claim 3; and
a semiconductor device mounted on the RFID tag substrate.

5. An RFID system comprising:
the RFID tag according to claim 4; and
a reader-writer including an antenna that transmits and receives a radio wave to and from the RFID tag.

6. An RFID tag comprising:
the RFID tag substrate according to claim 2; and
a semiconductor device mounted on the RFID tag substrate.

7. An RFID system comprising:
the RFID tag according to claim 6; and
a reader-writer including an antenna that transmits and receives a radio wave to and from the RFID tag.

8. The RFID tag substrate according to claim 1,
wherein the insulating substrate has the mounting region positioned at a center portion of the first surface, and the end portion of the coil that is closer to the first surface of the insulating substrate includes a fourth coil conductor that has an internal dimension smaller than an internal dimension of each of the first and second coil conductors.

9. The RFID tag substrate according to claim 8,
wherein the first coil conductors and the second coil conductors are displaced from each other in a perspective plan view.

10. An RFID tag comprising:
the RFID tag substrate according to claim 9; and
a semiconductor device mounted on the RFID tag substrate.

11. An RFID system comprising:
the RFID tag according to claim 10; and
a reader-writer including an antenna that transmits and receives a radio wave to and from the RFID tag.

12. An RFID tag comprising:
the RFID tag substrate according to claim 8; and
a semiconductor device mounted on the RFID tag substrate.

13. An RFID system comprising:
the RFID tag according to claim 12; and
a reader-writer including an antenna that transmits and receives a radio wave to and from the RFID tag.

14. The RFID tag substrate according to claim 1,
wherein the first coil conductors and the second coil conductors are displaced from each other in a perspective plan view.

15. An RFID tag comprising:
the RFID tag substrate according to claim 14; and
a semiconductor device mounted on the RFID tag substrate.

16. An RFID system comprising:
the RFID tag according to claim 15; and
a reader-writer including an antenna that transmits and receives a radio wave to and from the RFID tag.

17. An RFID tag comprising:
the RFID tag substrate according to claim 1; and
a semiconductor device mounted on the RFID tag substrate.

18. An RFID system comprising:
the RFID tag according to claim 17; and
a reader-writer including an antenna that transmits and receives a radio wave to and from the RFID tag.

* * * * *